(12) United States Patent
Ciubotaru et al.

(10) Patent No.: US 10,291,207 B2
(45) Date of Patent: May 14, 2019

(54) WIDE RANGE PROGRAMMABLE RESISTOR FOR DISCRETE LOGARITHMIC CONTROL, AND TUNING CIRCUIT FOR VARIABLE GAIN ACTIVE FILTER USING SAME

(71) Applicant: Analog Devices, Inc., Norwood, MA (US)

(72) Inventors: Alexandru Aurelian Ciubotaru, Somerset, NJ (US); Robert C. Glenn, Cary, NC (US)

(73) Assignee: Analog Devices, Inc., Norwood, MA (US)

( * ) Notice: Subject to any disclaimer, the term of this patent is extended or adjusted under 35 U.S.C. 154(b) by 157 days.

(21) Appl. No.: 15/204,673

(22) Filed: Jul. 7, 2016

(65) Prior Publication Data

US 2018/0013406 A1    Jan. 11, 2018

(51) Int. Cl.
*H03H 11/12* (2006.01)
*H03H 5/12* (2006.01)

(52) U.S. Cl.
CPC .......... *H03H 11/1291* (2013.01); *H03H 5/12* (2013.01); *H03H 2210/017* (2013.01); *H03H 2210/028* (2013.01)

(58) Field of Classification Search
CPC ................. H03H 11/1291; H03H 5/12; H03H 2210/017; H03H 2210/028
USPC ................ 327/306, 308, 551–559; 333/81 R
See application file for complete search history.

(56) References Cited

U.S. PATENT DOCUMENTS

| 4,628,276 | A | 12/1986 | Mizutani |
| 4,862,136 | A | 8/1989 | Birkner |
| 4,882,761 | A | 11/1989 | Waldhauer |
| 4,882,762 | A | 11/1989 | Waldhauer |
| 5,602,925 | A | 2/1997 | Killion |
| 5,923,159 | A | 7/1999 | Ezell |
| 6,111,467 | A | 8/2000 | Luo |

(Continued)

OTHER PUBLICATIONS

"International Application Serial No. PCT/US14/11841, International Preliminary Report on Patentability dated Aug. 13, 2015", 5 pgs.

(Continued)

*Primary Examiner* — Dinh T Le
(74) *Attorney, Agent, or Firm* — Schwegman Lundberg & Woessner, P.A.

(57) ABSTRACT

A programmable resistor can provide discrete logarithmic (linear-in-dB) gain control. It can include multiple like programmable resistor subnetworks or cells, such as can be connected in parallel, such as according to a decoding scheme. The subnetworks can be configured to cover a subrange such as [0 dB, −6 dB) relative to the maximum resistance value. Coarse increments of −6 dB can be further added to this range by successively doubling the number of subnetworks that are connected in parallel. An additional decoder help ensure a linear control curve, free of dead zones or other nonlinearities. The programmable resistor can be suitable for use in such circuits as programmable-gain amplifiers, filters, or more complex networks, such as where the resistance can be programmed as a function of a digital code. An example including a tuning circuit for a variable gain active filter is described.

25 Claims, 28 Drawing Sheets

(56) References Cited

U.S. PATENT DOCUMENTS

| | | | | |
|---|---|---|---|---|
| 6,307,490 | B1 * | 10/2001 | Litfin | H03M 1/1033 |
| | | | | 341/121 |
| 6,492,876 | B1 * | 12/2002 | Kamal | H03G 5/00 |
| | | | | 330/260 |
| 6,570,447 | B2 | 5/2003 | Cyrusian et al. | |
| 6,833,802 | B1 * | 12/2004 | Schrodinger | H03M 1/664 |
| | | | | 341/141 |
| 7,050,762 | B2 | 5/2006 | Boldt et al. | |
| 7,057,451 | B2 | 6/2006 | Lou et al. | |
| 7,208,955 | B2 | 4/2007 | Zansky et al. | |
| 7,349,017 | B2 | 3/2008 | Tan et al. | |
| 7,372,330 | B2 | 5/2008 | Yoshizawa et al. | |
| 7,605,659 | B2 | 10/2009 | Hughes | |
| 7,619,465 | B2 | 11/2009 | Kondo et al. | |
| 7,619,502 | B2 | 11/2009 | Prabhakaran et al. | |
| 7,675,380 | B2 | 3/2010 | Chiu | |
| 7,688,059 | B2 | 3/2010 | Fujiyama et al. | |
| 7,729,491 | B2 * | 6/2010 | Kahl | H03G 1/0088 |
| | | | | 379/390.02 |
| 7,795,978 | B2 | 9/2010 | Watai | |
| 8,054,208 | B2 * | 11/2011 | Fletcher | H03F 3/45475 |
| | | | | 341/139 |
| 8,076,995 | B2 | 12/2011 | Chiu | |
| 8,604,955 | B2 * | 12/2013 | Oishi | H04L 27/04 |
| | | | | 341/118 |
| 8,836,416 | B2 | 9/2014 | Fan et al. | |
| 9,583,241 | B1 * | 2/2017 | Dempsey | H03M 1/765 |
| 2012/0049857 | A1 | 3/2012 | Johansen et al. | |
| 2012/0194265 | A1 | 8/2012 | Katsube et al. | |

OTHER PUBLICATIONS

"International Application Serial No. PCT/US14/11841, International Search Report dated Jul. 8, 2014", 2 pgs.

"International Application Serial No. PCT/US14/11841, Written Opinion dated Jul. 8, 2014", 3 pgs.

Analog Devices, "Ultralow Distortion, Wide Bandwidth Voltage Feed Op Amps", AD9631/AD9632 Datasheet, Rev. B, (Jan. 2003), 1-19.

Fisher, William A., et al., "A Programmable Analog Neural Network Processor", *IEEE Transactions on Neural Networks*, 2(2), (Mar. 1991), 222-229.

Grassi, M., et al., "Flexible High-Accuracy Wide-Range Gas Sensor Interface for Portable Environmental Nosing Purpose", *IEEE International Symposium on Circuits and Systems*, (2005), 5385-5388.

Gruber, Daniel, et al., "A High-Input-Swing Common-Mode-Robust Programmable Gain Amplifier in 65nm CMOS", *2012 Proceedings of the ESSCIRC (ESSCIRC)*, (2012), 418-421.

Hsu, Cheng-Chung, et al., "A Highly Linear 125-MHz CMOS Switched-Resistor Programmable-Gain Amplifier", *IEEE Journal of Solid-State Circuits*, 38(10), (Oct. 2003), 1663-1670.

Sanyal, S. K., et al., "A Novel Microprocessor-Controlled Active-R Multifunction Network: Design of Programmable Filter, Oscillator, and FSK/PSK Wave Generator", *IEEE Transactions on Circuits and Systems*, 37(9), (Sep. 1990), 1085-1091.

Wolffenbuttel, Reinoud F., et al., "Digitally Programmable Accurate Current Sources for Logarithmic Control of the Amplification or Attenuation in a Gain Cell", *IEEE Journal of Solid-State Circuits*, 23(3), (Jun. 1988), 767-773.

Woo, Barry B., et al., "Digitally Rognunmable Gain Amplifiers with Arbitrary Range of Integer Values", *Proceedings of the IEEE*, 68(7), (1980), Jul. 1980.

Xiangning, Fan, et al., "A Switch Controlled Resistor Based CMOS PGA with DC Offset Cancellation for WSN RF Chip", *Proceedings of International Symposium on Signals, Systems and Electronics (ISSSE2010)*, (2010), 4 pgs.

\* cited by examiner

WIDE RANGE PROGRAMMABLE RESISTOR FOR DISCRETE LOGARITHMIC CONTROL, AND TUNING CIRCUIT FOR VARIABLE GAIN ACTIVE FILTER USING SAME

TECHNICAL FIELD

This document pertains generally, but not by way of limitation, to the field of integrated circuits, in particular to digitally-controlled resistors, and circuits using the same, such as a tuning circuit for a variable gain active filter.

BACKGROUND

A resistor having a resistance value that is programmable according to a digital code can be used as a building block, such as in a variable gain circuit. Its main function is to change resistance according to a digital code, which can be generated in the digital section of a more complex system, such as for the purpose of modifying the gain or attenuation, frequency response, or other parameters, in a controlled and repeatable manner that is appropriate for a digital signal processing environment.

Some applications (such as gain control) need a logarithmic (linear-in-dB) control curve for the resistance value, with the logarithm of the resistance value being a linear function of the control code. As a consequence, the resistance values corresponding to each code are usually irrational numbers, making the circuit design difficult and error-prone in the case of wide-range programmable structures implemented only with switched resistors.

For example, Killen U.S. Pat. No. 5,602,925 is directed toward a hearing aid with a programmable resistor that can provide logarithmic steps between higher values of programmed resistance and linear steps between lower values of programmed resistance.

While additional active stages can be used for coarser steps, e.g., in the case of programmable-gain amplifiers, this can cause additional power dissipation, noise, and distortion. Other approaches, such as using R-2R or power-of-2 resistor networks, are not suitable for logarithmic control. In addition, using capacitors in conjunction with resistor networks such as R-2R for filtering can be unwieldy, requiring more active stages.

SUMMARY

The present inventors have recognized, among other things, that a need in the art for a circuit that can offer the functionality and wide-range accuracy required by a single programmable resistor, such as which can be used in the feedback network of an operational amplifier for gain control, possibly in conjunction with a programmable capacitor for additional filtering.

This document describes, among other things, a programmable resistor that can include a number Q of programmable resistor cells that can be selectably couplable in parallel, where Q is greater than or equal to two. Individual ones of the programmable resistor cell can include a like arrangement of at least two resistors that can be individually programmable into a parallel configuration such as by respective individual series switches, such as to provide a resistance subrange that provides like logarithmic increments within the resistance subrange.

A decoder circuit can be configured to be capable of incrementally additionally selecting by group, into a parallel arrangement with a first one of the Q programmable cells, particular groups of $2^{k-1}$ of the Q programmable resistor cells where k is an integer greater than or equal to one, such as to establish a range of resistance values including (k+1) adjacent non-overlapping resistance subranges, with equal logarithmic increments between the adjacent non-overlapping resistance subranges within the range of resistance values provided by the programmable resistor.

The programmable resistor can be used in a variety of application, including in a tuning circuit for a variable gain active filter, an example of which is shown and described herein.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
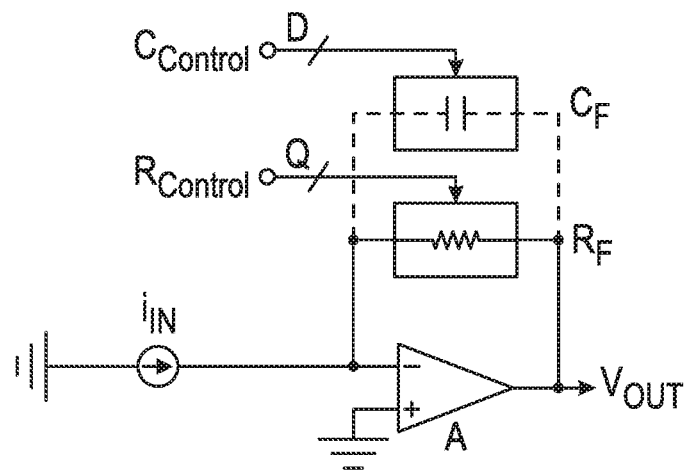
FIG. 1 is a diagram illustrating an example of a single-ended transimpedance amplifier/filter with programmable gain.

This document describes, among other things, a programmable resistor such as for discrete logarithmic (linear-in-dB) gain control, and an illustrative (non-limiting) example of its application in a tuning circuit for a variable gain active filter. The resistor can include multiple identical programmable resistor subnetworks (or "groups"). The subnetworks or groups can be connected in parallel, such as according to a decoding scheme. Each subnetwork or group can be controlled by a digital bus and can be configured to cover a specified range, such as [0 dB, −6 dB) relative to a maximum resistance value, in equal logarithmic (dB) steps, such as according to a number of subrange values, M. In this way, the M resistance values provided by each subnetwork or group can be equally spaced on a logarithmic scale at $$\frac{6}{M}\text{dB}$$

intervals. By connecting two like subnetworks in parallel and controlling their values, e.g., in the same way as for one subnetwork, the resulting resistance value range of the composite network can be the resistance value range of the original subnetwork shifted down by a factor of 2 (because of the parallel combination of two identical resistors), or −6 dB on a logarithmic scale. The spacing between two consecutive resistance values can be preserved, at $$\frac{6}{M}\text{dB}.$$

Thus, by selecting one subnetwork for the original [0 dB, −6 dB) range relative to the maximum resistance value, and two like subnetworks in parallel for the [−6 dB, −12 dB) range, a total range of [0 dB, −12 dB) can be achieved by duplicating the original resistor structure and using a convenient change in the digital control.

Extending the resistance range in increments of −6 dB can also therefore be possible following the technique described above. For example, an additional range of [−12 dB, −18 dB) can be obtained by connecting an additional two like subnetworks in parallel with the two subnetworks required for a [0 dB, −12 dB) range, an additional range of [−18 dB, −24 dB) can be obtained by connecting an additional four like subnetworks in parallel with the four subnetworks required for a [0 dB, −18 dB) range, and so on. In general, a total range of [0 dB, −6(Q+1) dB) can be obtained by connecting a total of $2^Q$ like subnetworks according to an appropriate decoding scheme. The decoding scheme described herein can be useful for accommodating additional resistance value control bits for the increased number of resistance values, and/or for helping ensure or provide a linear control curve, which can be free of dead zones or other nonlinearities.

A potential advantage of the described approach is that a wide resistance range can be achievable, such as by using a convenient-to-replicate elementary resistor subnetwork, and the passive, highly-linear nature of the circuit. The circuit configuration can be concentrated on a particular modular structure for accuracy of the resistance value subrange, which, in turn, can help guarantee the accuracy for the entire resistance value range.

The programmable resistor technique, such as the structure, configuration, and method of configuration or use, can be used, for example, in wide-range linear-in-dB low-distortion and low-noise programmable-gain amplifiers, filters, or other networks in which the resistance is desired to be a logarithmic function of a digital code, some illustrative examples of which are described herein.

FIG. 1 shows an example of a programmable resistor $R_F$ component or circuit (such as can have its resistance value be controlled by digital input $R_{control}$) in a feedback loop of an operational amplifier A such as for controlling a transimpedance gain. When an additional programmable capacitor $C_F$ component or circuit (such as can have its capacitance value be controlled by digital input $C_{control}$) is connected in parallel with $R_F$, the circuit can operate as a lowpass filter, with its low-frequency gain determined by the resistance value of the programmable resistor $R_F$ and cutoff frequency, Fc, determined by the $R_F C_F$ product, as shown by Equation 1.

$$Fc = \frac{1}{2\pi R_F C_F} \qquad \text{Eq. 1}$$

The circuit of FIG. 1 can be used in a variety of systems, such as in complex communications systems, such as in which there is a need for a programmable, wide-range, linear-in-dB transimpedance gain. Because the gain can be determined by the resistance value of $R_F$, the particular application needs (e.g., programmability, wide-range, linear-in-dB control) should be met by this programmable resistor. When the value of $R_F$ is changed by $R_{control}$, $C_{control}$ can also be used to change the capacitance value of $C_F$ for maintaining the same cutoff frequency, if desired.

Figure 2:
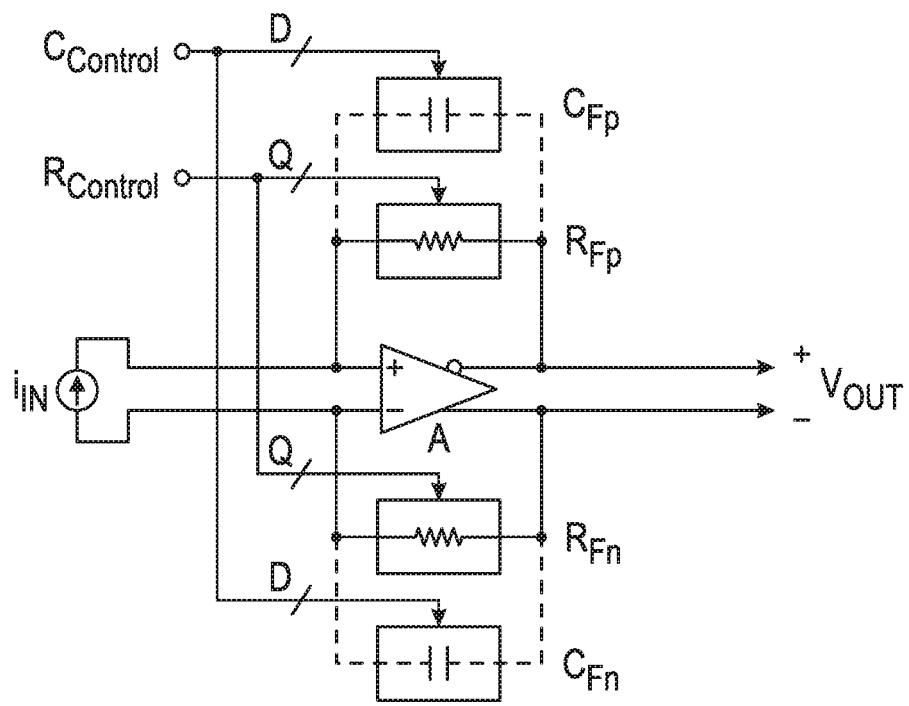
FIG. 2 is a diagram illustrating an example of a differential transimpedance amplifier/filter with programmable gain.

FIG. 2 shows an example of a differential variant of the circuit of FIG. 1. In FIG. 2, $R_{Fp}$ and $R_{Fn}$ can be like programmable resistors, and $C_{Fp}$ and $C_{Fn}$ can be like programmable capacitors.

Figure 3:
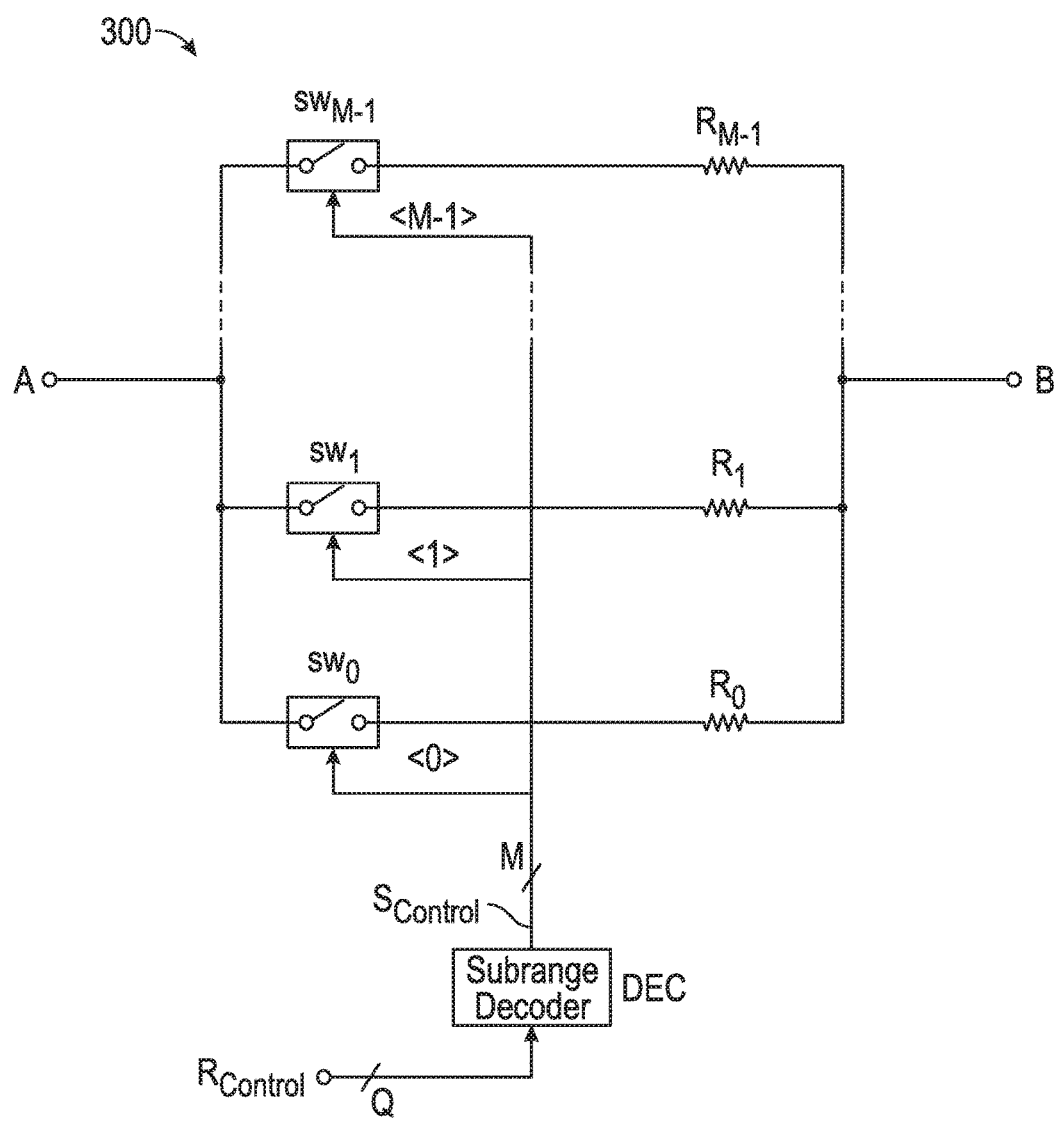
FIG. 3 is a diagram illustrating an example of a linear-in-dB programmable resistor with a small control range.

FIG. 3 shows an example of an implementation of a programmable resistor cell 300, such as the programmable resistor $R_F$ of FIG. 1. The switches $sw_0, sw_1, \ldots, sw_{M-1}$ can be implemented using one or more of a variety of devices or subcircuits, such as can include one or more of a transistor, a transmission gate, a relay, or one or more other structures. Individual resistors $R_0, \ldots, R_{M-1}$ of the programmable resistor cell 300 can be controlled by the $S_{control}$ digital output (e.g., having M bits, wherein M is a positive integer) of a subrange decoder DEC. For linear-in-dB programmability, which can employ irrational numbered resistance values presented between terminals A and B at different settings of $R_{control}$, different decoding schemes can be used for the subrange decoder. For example, the subrange decoder can have a configuration that selects individual resistors $R_0, \ldots, R_{M-1}$ one at a time, can have a thermometer configuration that selects only adjacent resistor branches, or can have a configuration that selects resistor branches according to a different principle. The programmable resistor cell 300 structure shown in FIG. 3 can be configured for a relatively small control range, such as 6 dB, or [0 dB, −6 dB) relative to the maximum resistance value. Wider resistance value ranges can be achieved, such as using one or more selectable parallel combinations of programmable resistor cell 300, such as described herein. Depending on the circuit application, the subrange decoder DEC in FIG. 3 can be configured such that the resistance value either of the programmable resistor cell 300 decreases with increasing $R_{control}$ code values (e.g., as illustrated conceptually in FIG. 4), or such that the resistance value of the programmable resistor cell 300 increases with increasing $R_{control}$ code values.

Figure 4:
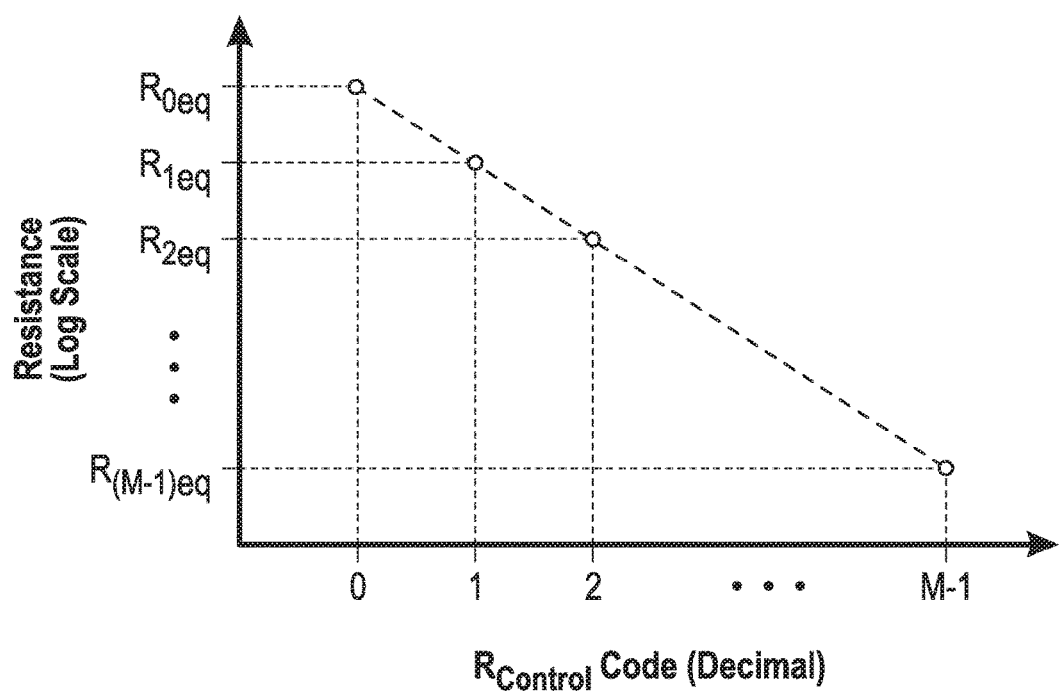
FIG. 4 is an example of a representation of the control characteristic of the programmable resistor in FIG. 3.

FIG. 4 illustrates conceptually an example of a graph of a controllable resistance characteristic of the programmable resistor cell 300 of FIG. 3, where M different resistance values $R_{0eq}, \ldots, R_{(M-1)eq}$ (along the log scale y-axis of the graph of FIG. 4) are presented between terminals A and B of the programmable resistor cell 300 as a function of the subrange decoder output code (along the x-axis of the graph of FIG. 4), and the resistance value decreases with increasing $R_{control}$ values. For linear-in-dB control of the desired [0 dB, −6 dB) range in M discrete steps, the resistance values of the programmable resistor cell 300 of FIG. 3 can be chosen to provide increments such as according to Eq. 2:

$$20 \times \log_{10} \frac{R_{ieq}}{R_{(i+1)eq}} = \frac{6}{M} dB, \quad \text{Eq. 2}$$

for each i, where $0 \leq i \leq (M-2)$. In this way, as shown in Eq. 3, $$20 \times \log_{10} \frac{R_{1eq}}{R_{Meq}} = \frac{M-1}{M} \times 6 \; dB, \quad \text{Eq. 3}$$

so the actual control range of a particular programmable resistor cell 300 of FIG. 3 can be as shown by Eq. 4:

$$\left[0 \; dB, -\frac{M-1}{M} \times 6 \; dB\right], \quad \text{Eq. 4}$$

which can approach a [0 dB, −6 dB) theoretical limit, such as for large values of M.

Figure 5:
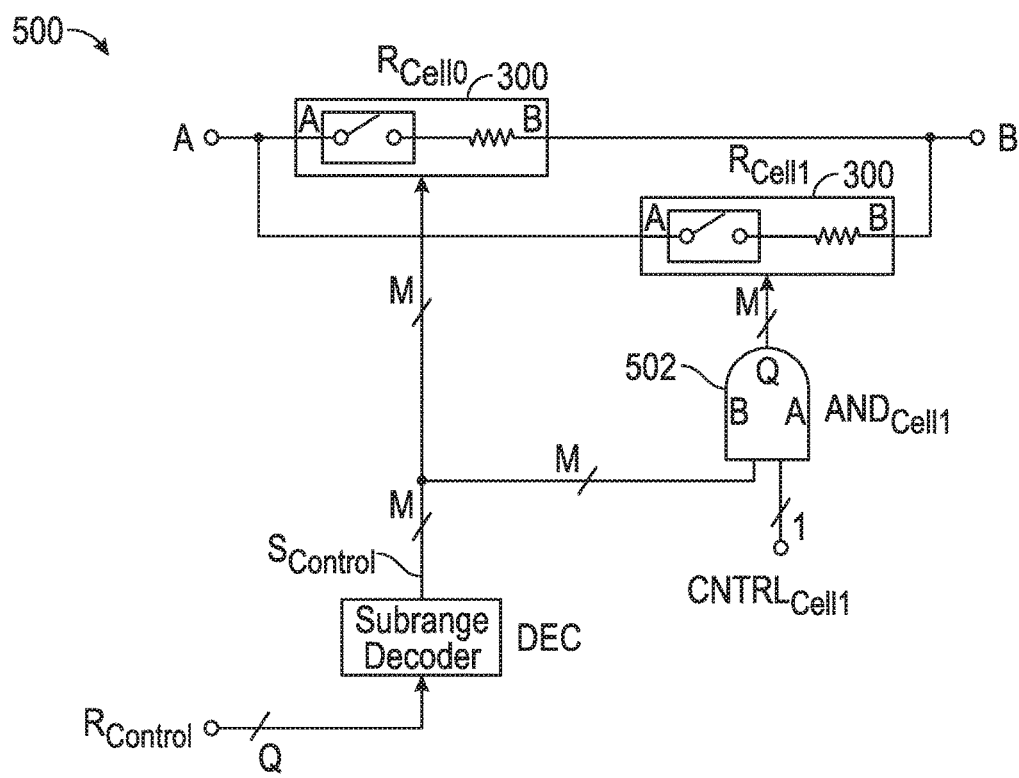
FIG. 5 is a diagram illustrating a first embodiment of a wide-range linear-in-dB programmable resistor, such as in accordance with the present subject matter.
Figure 6A:
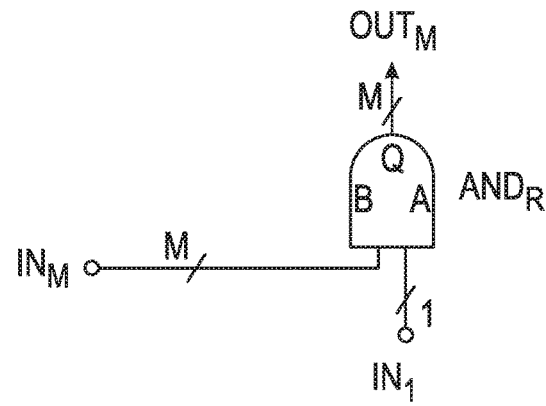
FIG. 6(a) is a diagram illustrating an example of a multiple-input AND gate.
Figure 6B:
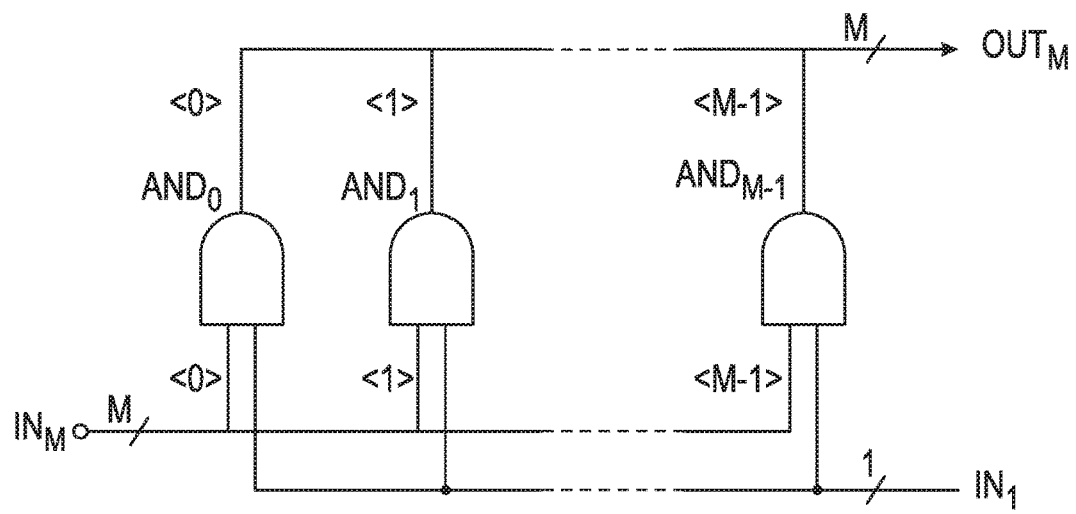
FIG. 6(b) is a diagram illustrating an example of a possibility for implementing the multiple-input AND gate of FIG. 6(a).

FIG. 5 shows an example of a composite programmable resistor 500 such as can employ the programmable resistor cell 300 of FIG. 3. In the example of FIG. 5, two like programmable resistor cells 300, $R_{cell0}$ and $R_{cell1}$, can be provided in the composite programmable resistor 500 structure, such as to extend the resistance range from that available using a single programmable resistor cell 300. In FIG. 5, the multiple-input logic AND gate $AND_{cell1}$ 502 can be used to selectively apply the output digital word of the subrange decoder Scontrol to resistor cell $R_{cell1}$ according to the logic value of the range control bit $CNTRL_{cell1}$. FIG. 6(b) shows an example of a possible implementation of the multiple-input AND gate $AND_{cell1}$ 502 using regular two-input AND gates. Assuming that a logic '0' bit in the $S_{control}$ bus in FIG. 3 effectively opens the switch it controls, and a logic '1' closes that switch, the operation of the circuit of FIG. 5 can be understood by first observing that, for $CNTRL_{cell1}$=logic '0', the $S_{control}$ output of the subrange decoder is applied only to $R_{cell0}$ (the control inputs of $R_{cell1}$ are all at logic '0', which disconnects all of its individual internal resistors), such that the circuit reverts to the configuration of FIG. 3, having the control characteristic of FIG. 4. For $CNTRL_{cell1}$=logic '1', the same $S_{control}$ word is applied to both $R_{cell0}$ and $R_{cell1}$, which has the net effect of reducing the $R_{cell0}$ resistance by half, or shifting its value in dB by −6 dB. In this way, by using a selectable additional like resistor cell 300 section, the original control range of one resistor cell 300 section ($R_{cell0}$) is extended by 6 dB, providing M additional resistance values, for a total of (2M−1) resistance values that are equally spaced on a logarithmic scale, in the range given by Eq. 5.

$$\left[0 \; dB, -6 - \frac{M-1}{M} \times 6 \; dB\right] \quad \text{Eq. 5}$$

Figure 7:
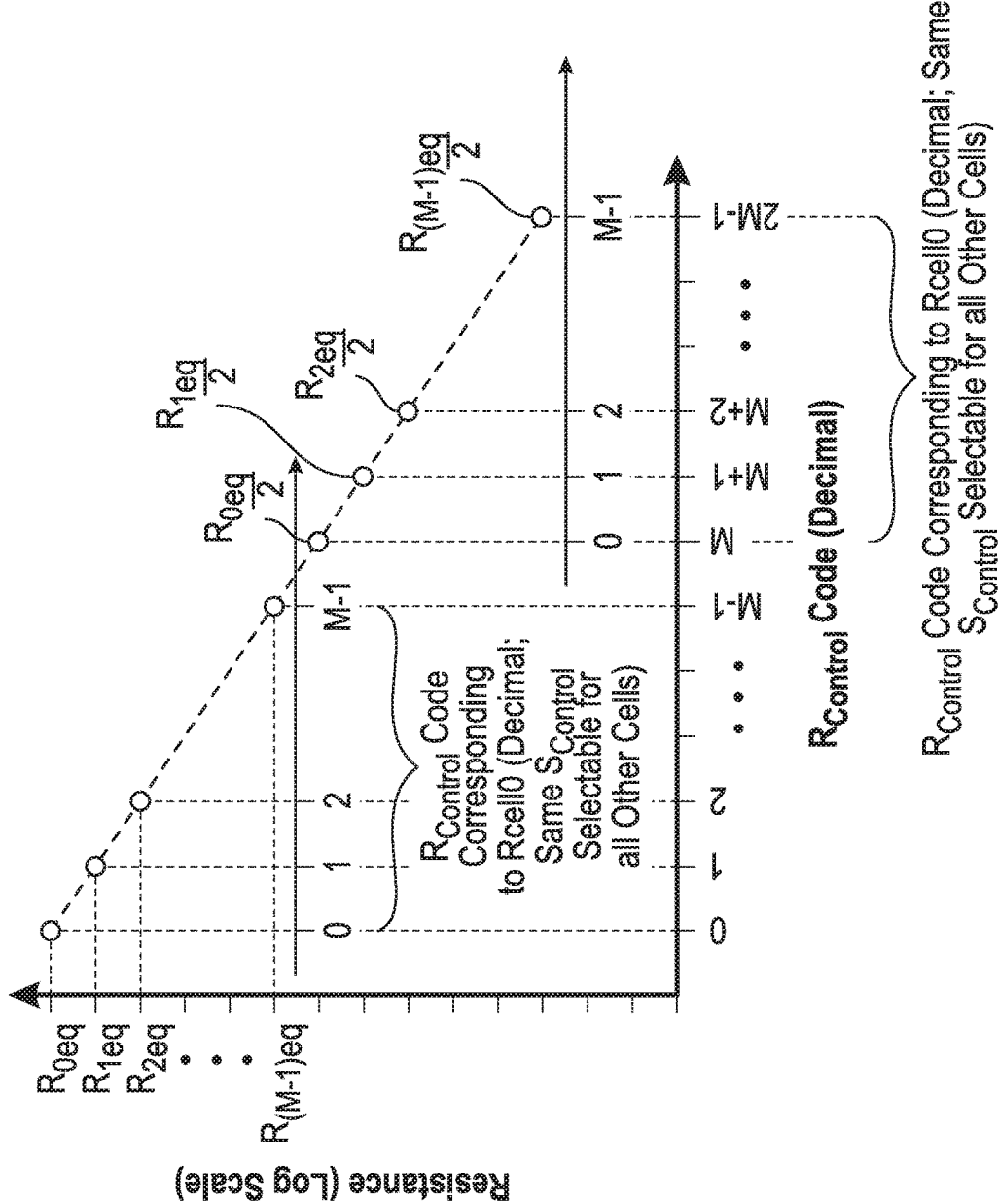
FIG. 7 is an example of a representation of the control characteristic of the programmable resistor in FIG. 5.

FIG. 7 shows an example of a control characteristic of the programmable resistor cell 500 such as shown in FIG. 5, with different resistance values along the log scale y-axis of the graph of FIG. 7 as a function of the (2M−1) $R_{control}$ code values along the x-axis of the graph of FIG. 7. In FIG. 7, the upper M resistance values are obtained for $CNTRL_{cell1}$='0' (only $R_{cell0}$ contributing to the values), and the lower M values are obtained for $CNTRL_{cell1}$='1' (both $R_{cell0}$ and $R_{cell1}$ contributing to the values).

Figure 8:
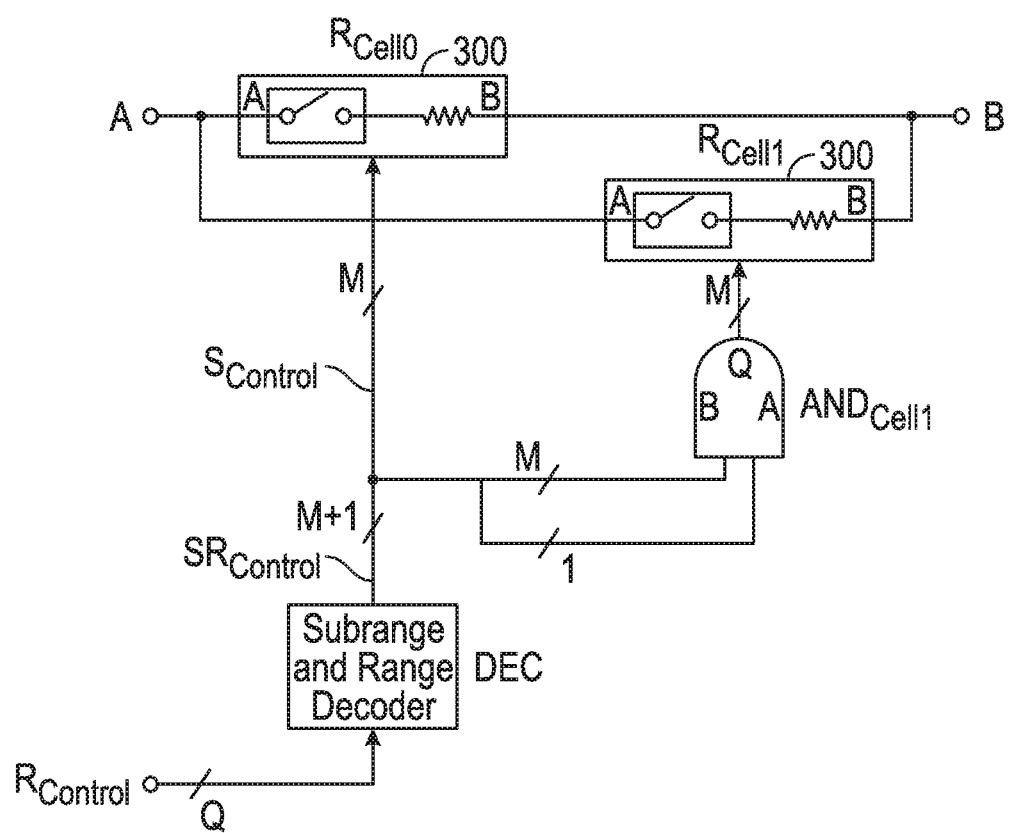
FIG. 8 is a diagram illustrating another embodiment of a wide-range linear-in-dB programmable resistor in accordance with the present subject matter.

FIG. 8 shows an example of a configuration in which the control bit $CNTRL_{cell1}$ can be eliminated, such as by integrating it in the output bus $SR_{control}$ of a subrange-and-range decoder, which can be configured for obtaining a linear control characteristic such as shown in FIG. 7. The resistance step (on a logarithmic scale) between the last point of the original range (upper points) and the first point of the additional range (lower points) is given in Equation 6:

$$\Delta R_{dB} = \quad \text{Eq. 6}$$
$$20\log \frac{R_{(M-1)eq}}{R_{0eq}/2} = 20\log 2 + 20\log \frac{R_{(M-1)eq}}{R_{0eq}} = 6 - \frac{M-1}{M} 6 = \frac{6}{M} dB,$$

which is the same as the step between two successive resistance values in the original resistance range, which can help ensure the linearity (on a logarithmic scale) of the control characteristic of FIG. 7.

Figure 9:
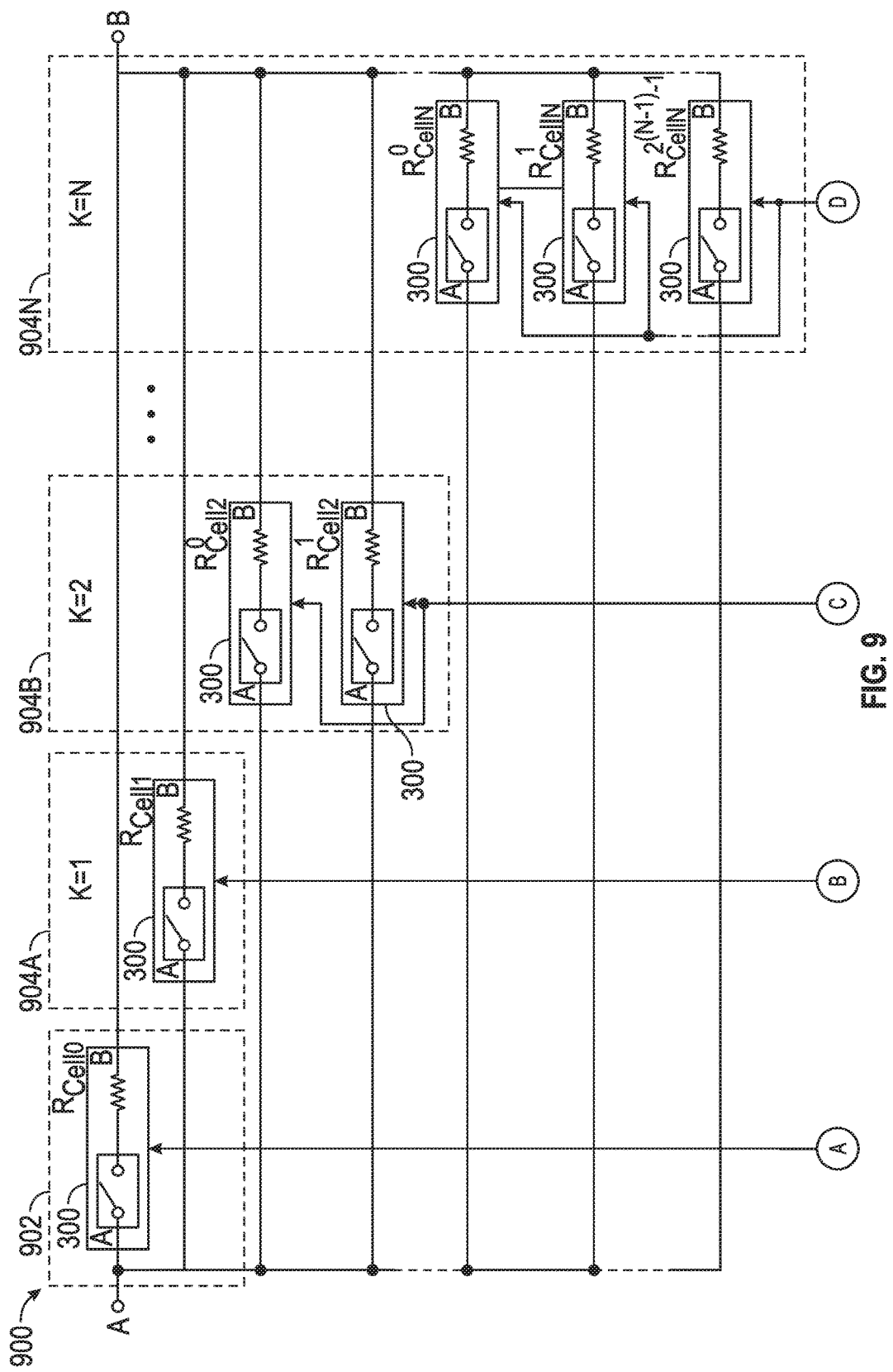
FIG. 9 is a diagram illustrating yet another embodiment of a wide-range linear-in-dB programmable resistor in accordance with the present subject matter.
Figure 9:
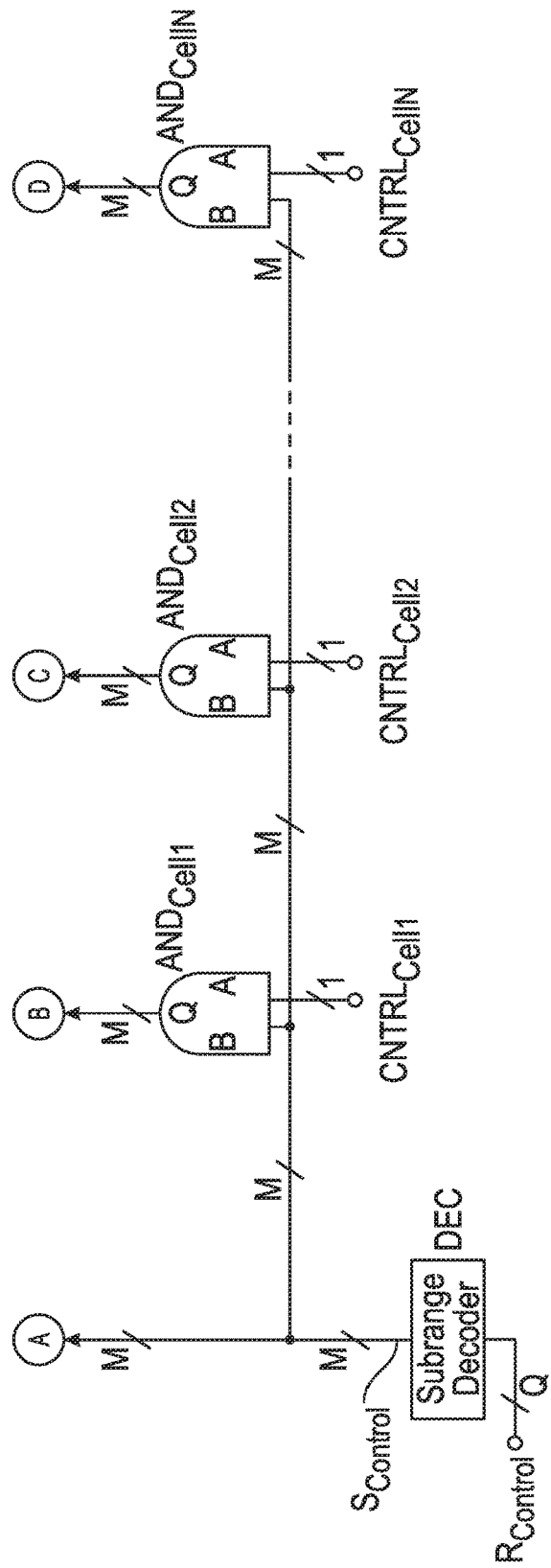

FIG. 9 shows another example of a composite programmable resistor 900 structure, which can be a generalization of the composite programmable resistor structure 500 structure shown in FIG. 5, with the composite programmable resistor 900 structure representing a programmable resistor having an arbitrarily-large extended range. The composite programmable resistor 900 can employ a base cell bank 902 (which can include a single resistor cell 300) and can employ N additional cell banks ("groups") 904A, . . . , 904N relative to the configuration of FIG. 3, where each group 904 or cell bank k, for k=1, . . . , N, can include or consist of $2^{(k-1)}$ like programmable resistor cells 300 such as shown in FIG. 3, which can be connected in parallel and between the outside terminals of the composite programmable resistor structure 900. Each particular group 904 or cell bank k can be controlled by a range control bit $CNTRL_{cellk}$, k=1, . . . , N, which can enable or disable the application of the subrange control word $S_{control}$ to that particular group 904 or cell bank of programmable resistor cells 300. The range extension can be achieved in increments, such as of −6 dB, such as by successively halving the total resistance of the composite resistor structure 900 by successively exercising the range control bits $CNTRL_{cellk}$, k=1, . . . , N, such as in a thermometer fashion (e.g., for a given k, if $CNTRL_{cellk}$='1', then $CNTRL_{cellj}$='1', for j=1, . . . , k−1).

Figure 10:
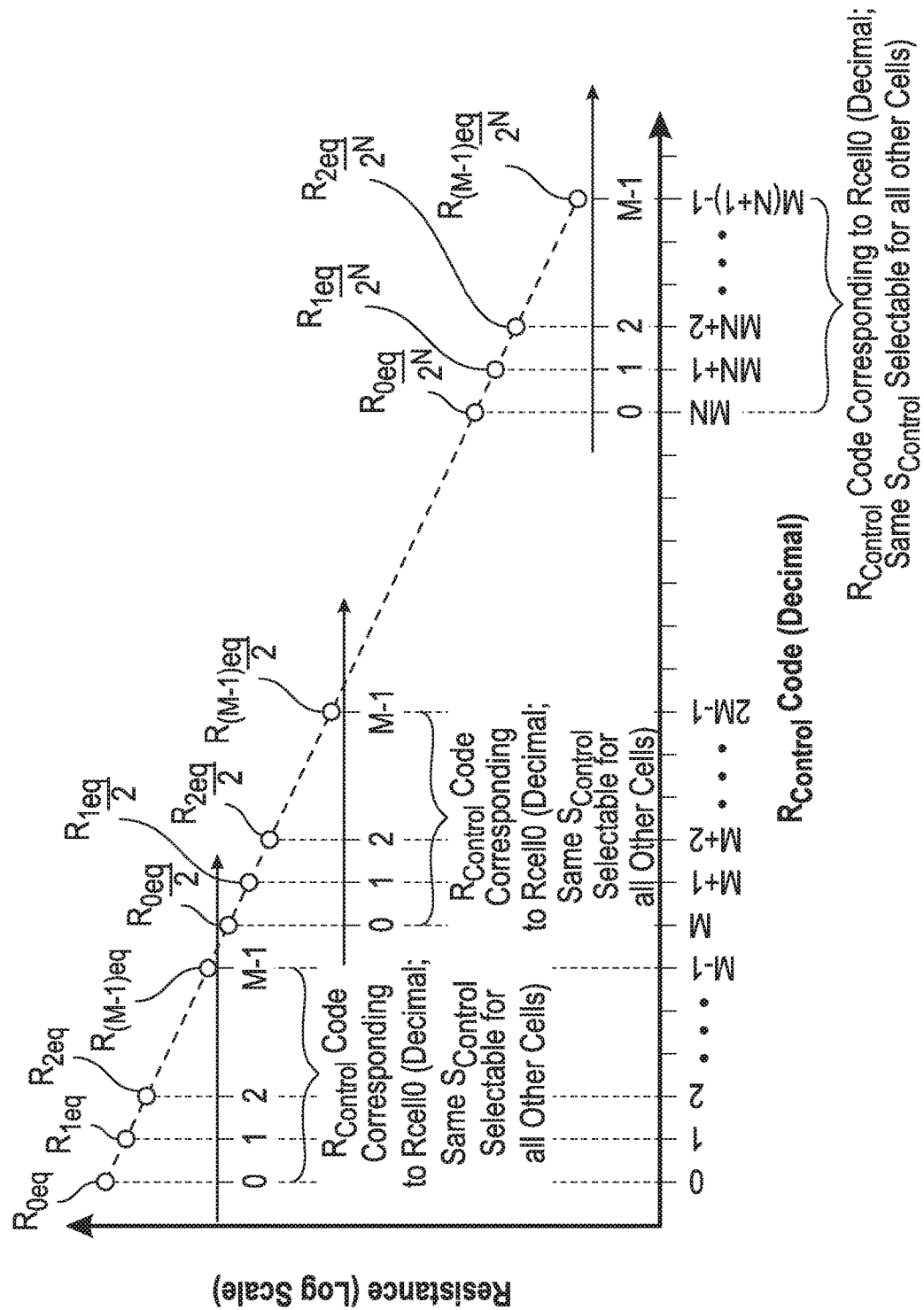
FIG. 10 is an exemplary representation of the control characteristic of the programmable resistor in FIG. 9.

FIG. 10 shows an example of a control characteristic of the composite programmable resistor 900 structure of FIG. 9, similar to the control characteristic of FIG. 7. In FIG. 10, the upper M resistance values can be obtained for $CNTRL_{cell1}$, . . . , N='0' (e.g., with only $R_{cell0}$ contributing to the resistance values), the next lower M resistance values can be obtained for $CNTRL_{cell1}$='1' and $CNTRL_{cell2}$, . . . , N='0' (e.g., with only $R_{cell0}$ and $R_{cell1}$ contributing to the resistance values), the next lower M values can be obtained for $CNTRL_{cell1,2}$='1' and $CNTRL_{cell3}$, . . . , N='0' (with only $R_{cell0}$, $R_{cell1}$, $R_{cell2}^{0}$ and $R_{cell2}^{1}$ contributing to the resistance values), and so on, until the lowest M values, which can be obtained for $CNTRL_{cell1}$, . . . , N='1' (all resistor cells $R_{cellj}^{i}$, i=0, . . . , $2^{(j-1)}-1$; j=1, . . . , N contributing to the resistance values). The total resistance range of the composite programmable resistor 900 of FIG. 9 can be as given in Eq. 7 as:

$$\left[ 0 \text{ dB}, -N \times 6 - \frac{M-1}{M} \times 6 \text{ dB} \right]. \quad \text{Eq. 7}$$

The resistance step (on a logarithmic scale) between the last point of one subrange and the first point of the next subrange range is given by Eq. 6 and is the same as the step between two successive values in any given individual subrange $$\left( \frac{6}{M} \text{ dB} \right),$$

which can help ensure the linearity (on a logarithmic scale) of the control characteristic of FIG. 10, which can have a total number of M (N+1) individual control points providing corresponding programmably selectable resistance values.

Figure 11:
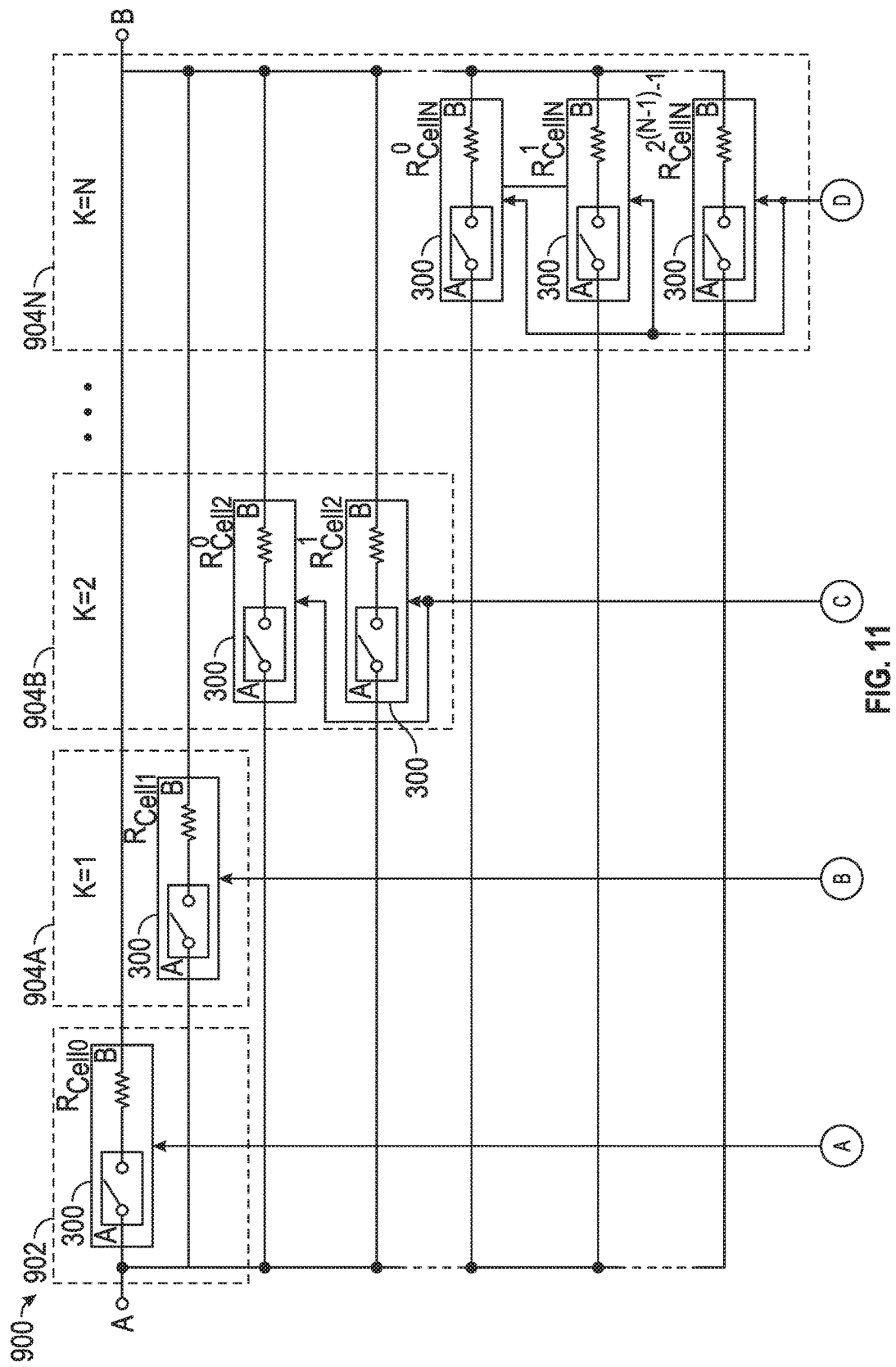
FIG. 11 is a diagram illustrating yet another embodiment of a wide-range linear-in-dB programmable resistor in accordance with the present subject matter.
Figure 11:
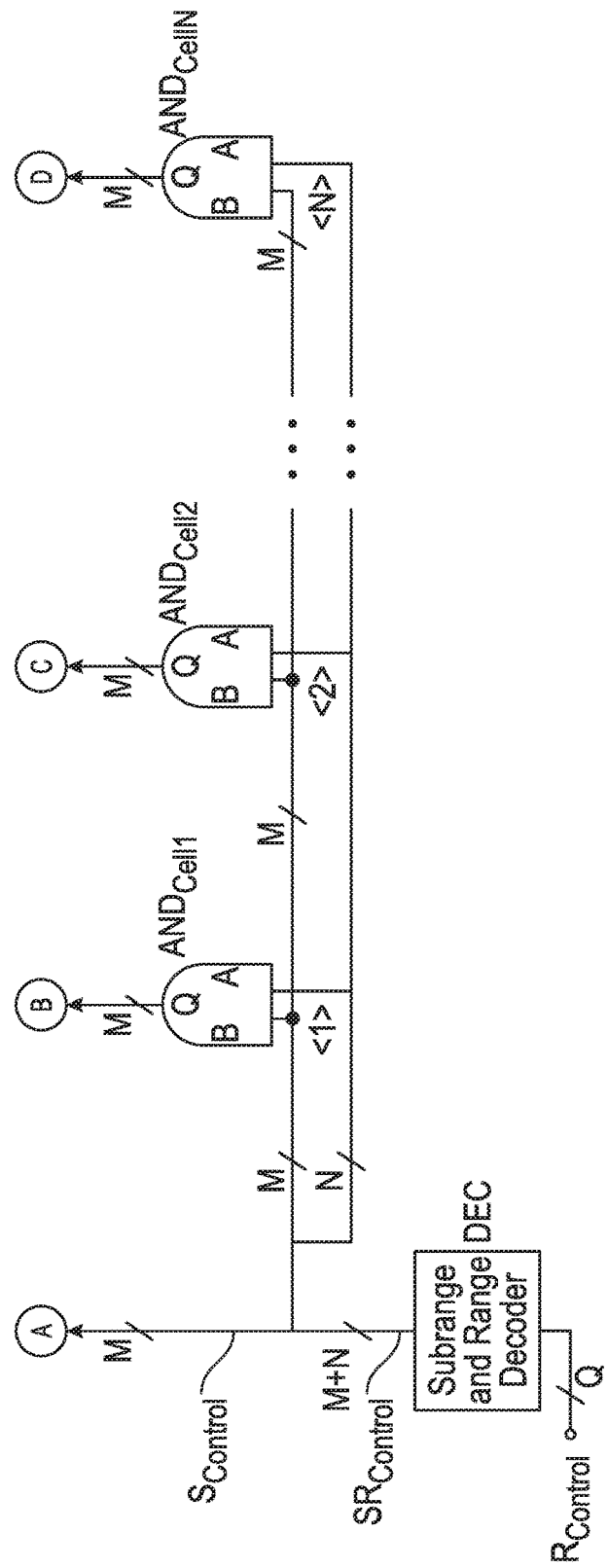

Similar to the technique such as shown and described with respect to FIG. 8, the control bits $CNTRL_{cell1, . . . , N}$ in FIG. 9 can be eliminated, such as shown in FIG. 11, such as by integrating them in the output bus $SR_{control}$ of a subrange-and-range decoder, which can be configured for obtaining a linear control characteristic such as shown in FIG. 10.

Figure 12:
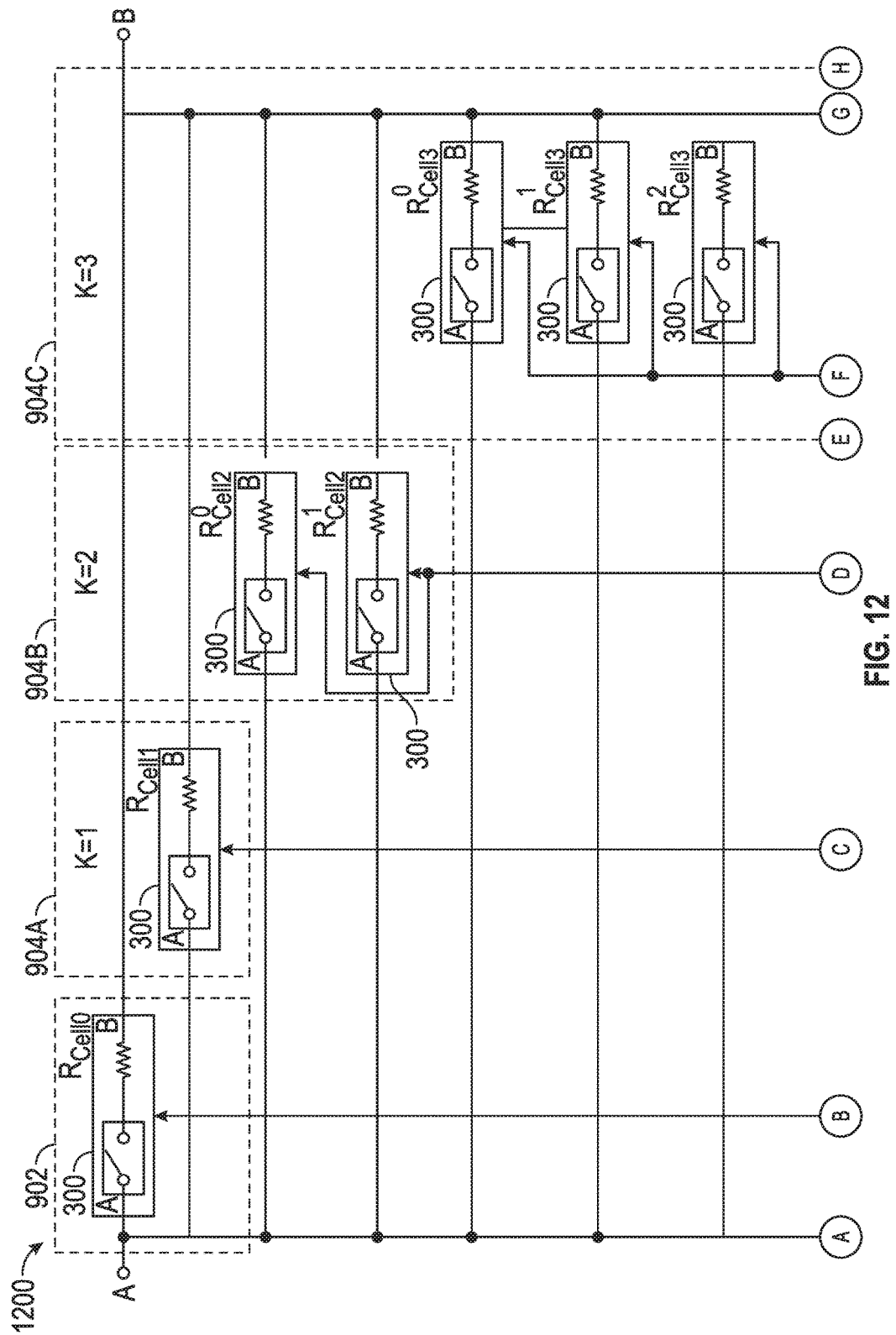
FIG. 12 is a diagram illustrating yet another embodiment of a wide-range linear-in-dB programmable resistor in accordance with the present subject matter.
Figure 12:
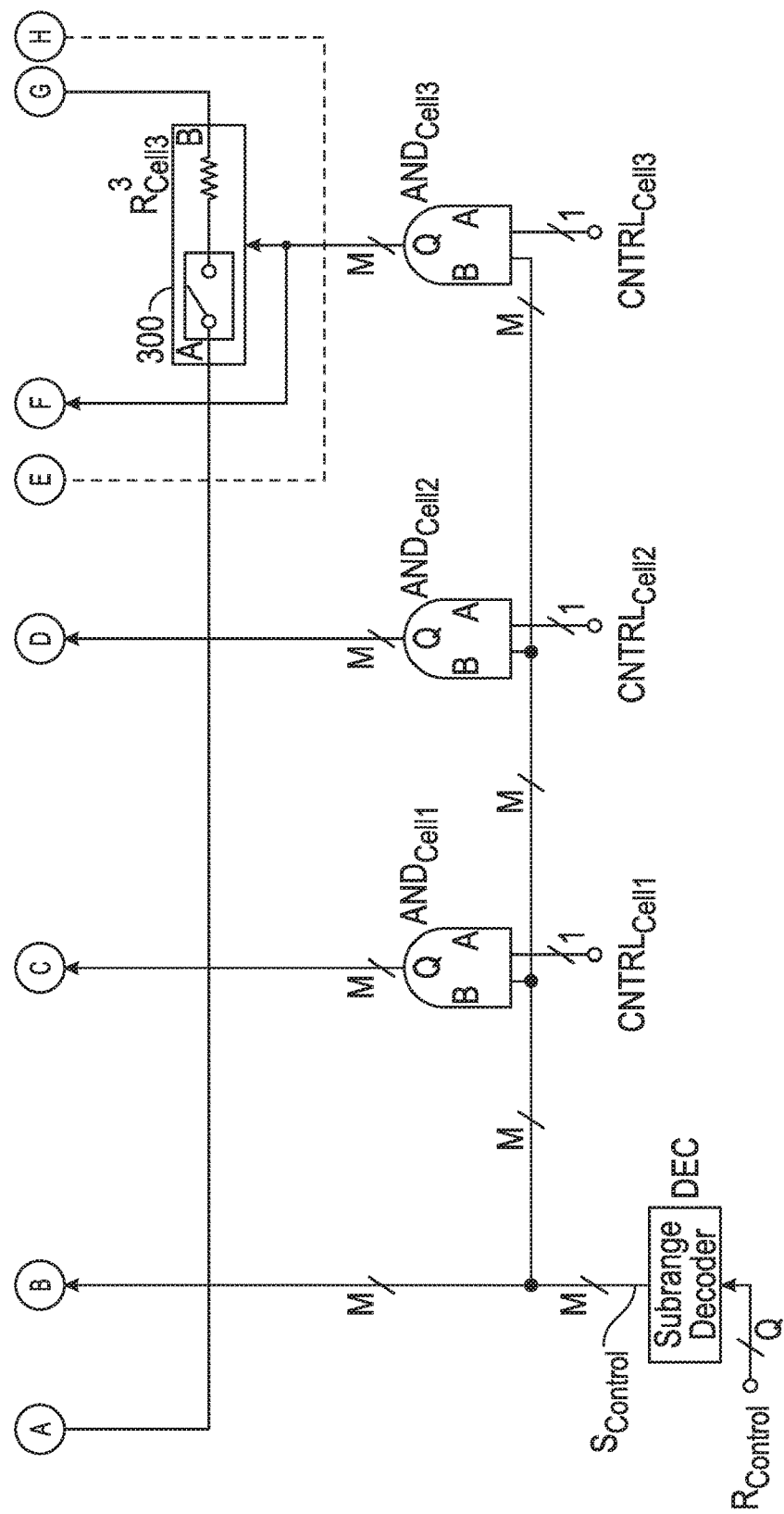
Figure 13:
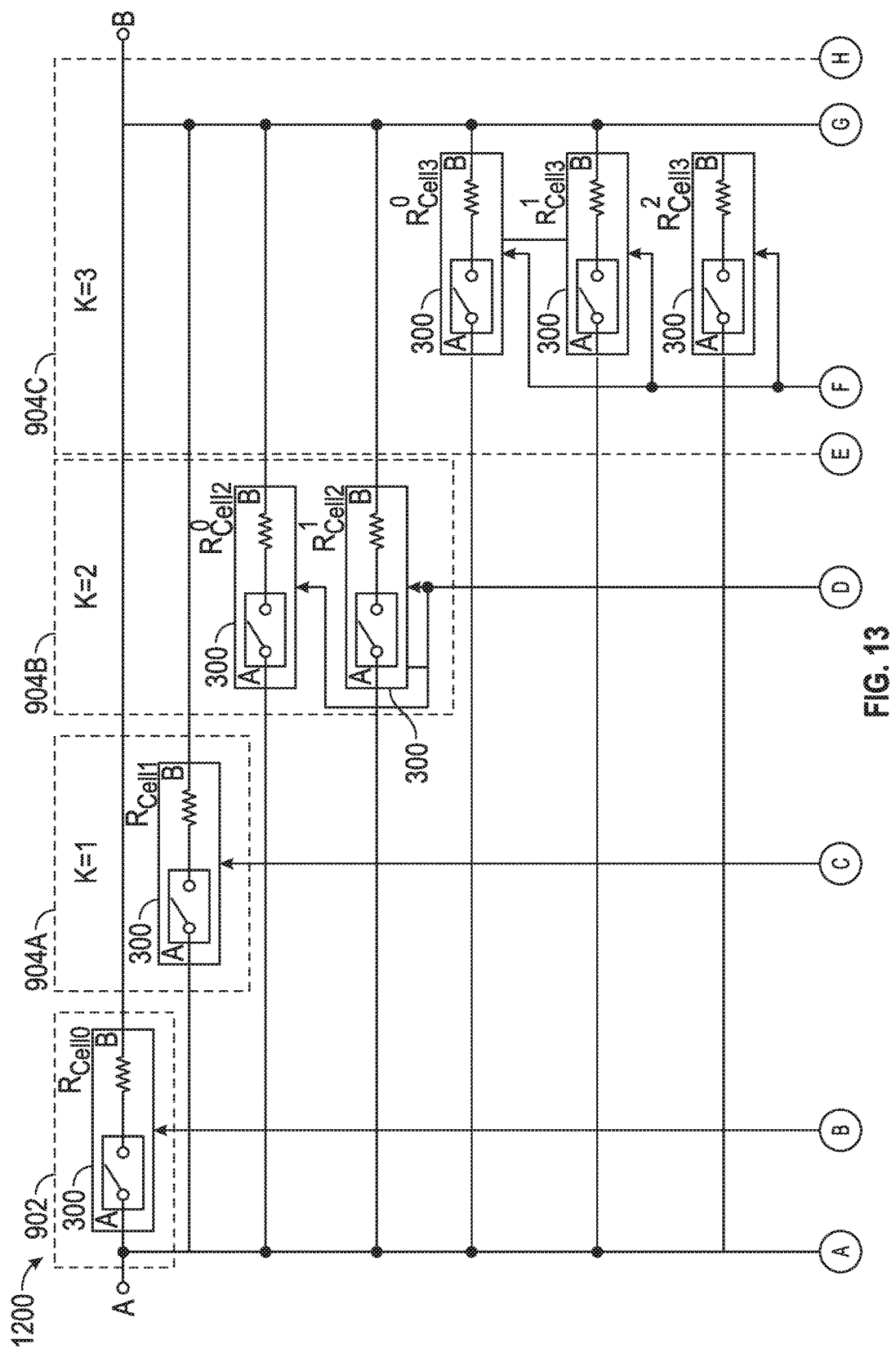
FIG. 13 is a diagram illustrating yet another embodiment of a wide-range linear-in-dB programmable resistor in accordance with the present subject matter.
Figure 13:
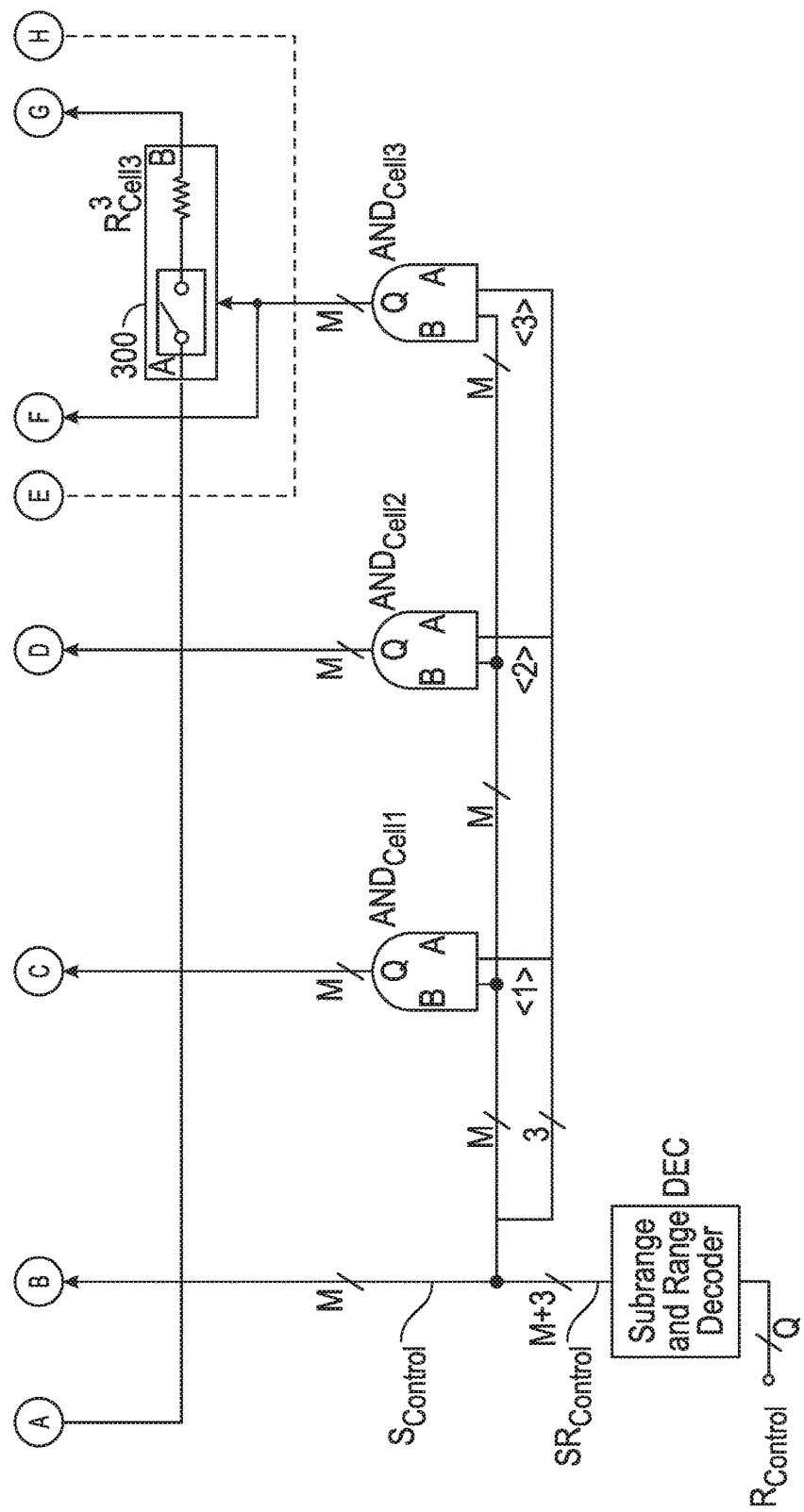

FIGS. 12-13 show an example of a particular implementation of the present subject matter, more specifically an example of a 0-23 dB programmable resistance-valued resistor with 1-dB steps between successive resistance-values. The programmable resistor circuit 1200 in FIGS. 12 and 13 is a specific implementation example of the generalized concept shown in FIGS. 9 and 11, respectively, with the specific example using N=3 additional cell banks or groups 904 (for a total of 8 identical programmable resistor cells 300, including the base programmable resistor cell 300). Each programmable resistor cell $R_{cellj}^{i}$, i=0, . . . , $2^{(j-1)}-1$; j=1, . . . , 3, can have the configuration shown in FIG. 3, such as where M=6, for 6 equal 1-dB steps in resistance value. To illustrate the flexibility of the arrangement, the DEC decoders in FIGS. 12 and 13 can be configured to generate programmable resistance values that increase with increasing $R_{control}$ code values. The individual resistance values presented by each individual programmable resistor 300 in FIG. 3, such as when the switches are closed one by one, are illustrated in the example of Table 1.

TABLE 1

| $S_{control}$<5:0> | | | | | | |
|---|---|---|---|---|---|---|
| <5> | <4> | <3> | <2> | <1> | <0> | $R_{AB}$ (Ω) |
| 0 | 0 | 0 | 0 | 0 | 0 | ∞ |
| 0 | 0 | 0 | 0 | 0 | 1 | 14225 ($R_0$) |
| 0 | 0 | 0 | 0 | 1 | 0 | 16595 ($R_1$) |
| 0 | 0 | 0 | 1 | 0 | 0 | 18492 ($R_2$) |
| 0 | 0 | 1 | 0 | 0 | 0 | 20863 ($R_3$) |
| 0 | 1 | 0 | 0 | 0 | 0 | 23329 ($R_4$) |
| 1 | 0 | 0 | 0 | 0 | 0 | 2845 ($R_5$) |

If the control signals of the switches follow a thermometer scheme (e.g., in which a switch is closed only after higher-rank switches are closed), six 1-dB-spaced resistance values can be obtained, such as shown in Table 2.

TABLE 2

| $S_{control}$<5:0> | | | | | | | |
|---|---|---|---|---|---|---|---|
| <5> | <4> | <3> | <2> | <1> | <0> | $R_{AB}$ (Ω) | $R_{AB}$ (dB) |
| 1 | 0 | 0 | 0 | 0 | 0 | 2845 | 0 |
| 1 | 1 | 0 | 0 | 0 | 0 | 2535 | −1 |
| 1 | 1 | 1 | 0 | 0 | 0 | 2260 | −2 |
| 1 | 1 | 1 | 1 | 0 | 0 | 2014 | −3 |
| 1 | 1 | 1 | 1 | 1 | 0 | 1796 | −4 |
| 1 | 1 | 1 | 1 | 1 | 1 | 1595 | −5 |

Table 3 shows the final resistance values as functions of the $R_{control}$ code values of the configuration shown in FIG. 13 and the corresponding output bits of decoder DEC, which can accommodate the range-select bits in FIG. 12 such as by using $SR_{control}$<8>=$CNTRL_{cell1}$, $SR_{control}$<7>=$CNTRL_{cell2}$, and $SR_{control}$<6>=$CNTRL_{cell3}$.

TABLE 3

| R_control (decimal) | SR_control<8:6> | | | SR_control<5:0> | | | | | | R_AB (Ω) | R_AB (dB) |
|---|---|---|---|---|---|---|---|---|---|---|---|
| | <8> | <7> | <6> | <5> | <4> | <3> | <2> | <1> | <0> | | |
| 0 | 1 | 1 | 1 | 1 | 1 | 1 | 1 | 1 | 1 | 199.3 | 0 |
| 1 | 1 | 1 | 1 | 1 | 1 | 1 | 1 | 1 | 0 | 224.5 | +1 |
| 2 | 1 | 1 | 1 | 1 | 1 | 1 | 1 | 0 | 0 | 251.7 | +2 |
| 3 | 1 | 1 | 1 | 1 | 1 | 1 | 0 | 0 | 0 | 282.5 | +3 |
| 4 | 1 | 1 | 1 | 1 | 1 | 0 | 0 | 0 | 0 | 316.8 | +4 |
| 5 | 1 | 1 | 1 | 1 | 0 | 0 | 0 | 0 | 0 | 355.6 | +5 |
| 6 | 1 | 1 | 0 | 1 | 1 | 1 | 1 | 1 | 1 | 398.7 | +6 |
| 7 | 1 | 1 | 0 | 1 | 1 | 1 | 1 | 1 | 0 | 449 | +7 |
| 8 | 1 | 1 | 0 | 1 | 1 | 1 | 1 | 0 | 0 | 503.5 | +8 |
| 9 | 1 | 1 | 0 | 1 | 1 | 1 | 0 | 0 | 0 | 565 | +9 |
| 10 | 1 | 1 | 0 | 1 | 1 | 0 | 0 | 0 | 0 | 633.7 | +10 |
| 11 | 1 | 1 | 0 | 1 | 0 | 0 | 0 | 0 | 0 | 711.2 | +11 |
| 12 | 1 | 0 | 0 | 1 | 1 | 1 | 1 | 1 | 1 | 797.5 | +12 |
| 13 | 1 | 0 | 0 | 1 | 1 | 1 | 1 | 1 | 0 | 898 | +13 |
| 14 | 1 | 0 | 0 | 1 | 1 | 1 | 1 | 0 | 0 | 1007 | +14 |
| 15 | 1 | 0 | 0 | 1 | 1 | 1 | 0 | 0 | 0 | 1130 | +15 |
| 16 | 1 | 0 | 0 | 1 | 1 | 0 | 0 | 0 | 0 | 1267.5 | +16 |
| 17 | 1 | 0 | 0 | 1 | 0 | 0 | 0 | 0 | 0 | 1422.5 | +17 |
| 18 | 0 | 0 | 0 | 1 | 1 | 1 | 1 | 1 | 1 | 1595 | +18 |
| 19 | 0 | 0 | 0 | 1 | 1 | 1 | 1 | 1 | 0 | 1796 | +19 |
| 20 | 0 | 0 | 0 | 1 | 1 | 1 | 1 | 0 | 0 | 2014 | +20 |
| 21 | 0 | 0 | 0 | 1 | 1 | 1 | 0 | 0 | 0 | 2260 | +21 |
| 22 | 0 | 0 | 0 | 1 | 1 | 0 | 0 | 0 | 0 | 2535 | +22 |
| 23 | 0 | 0 | 0 | 1 | 0 | 0 | 0 | 0 | 0 | 2845 | +23 |

Figure 14:
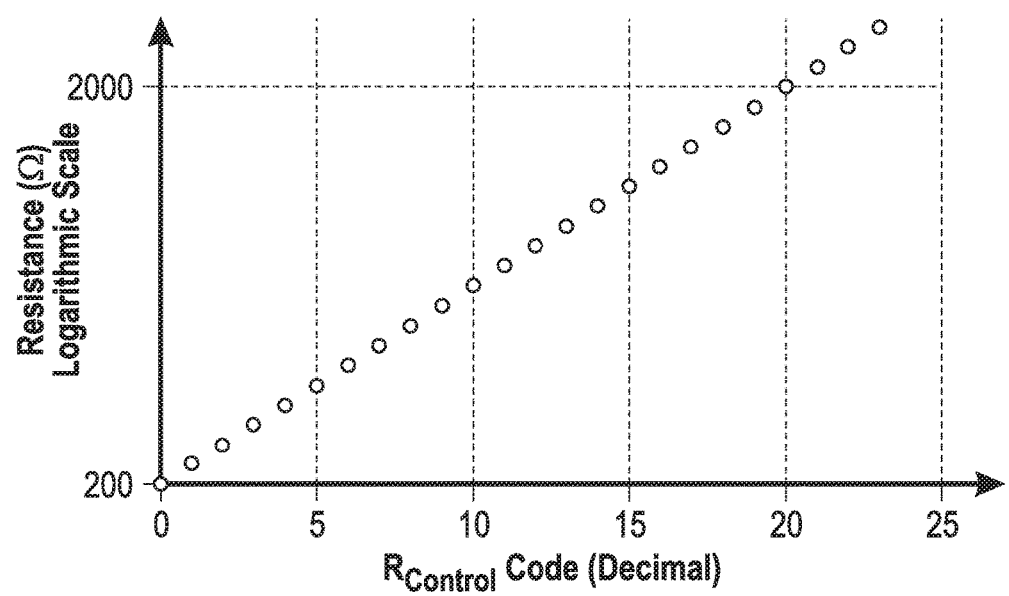
FIG. 14 is an example of a representation of the control characteristic of the programmable resistor in FIG. 12 or 13.

FIG. 14 shows an example of the control characteristic of the programmable resistor 1200 in FIG. 12 or 13. Only one programmable resistor cell 300 need involve analog circuit design work, for ensuring the values listed in Table 1. The wide range of the final programmable resistor 1200 can be ensured by the proper replication of this programmable resistor cell 300 structure, and by inexpensive digital design for the decoder.

Example of Application of Programmable Resistor in a Tuning Circuit for a Variable Gain Active Filter To recap, FIG. 1 shows an example of a programmable resistor $R_F$ component or circuit (such as can have its resistance value be controlled by digital input $R_{control}$) in a feedback loop of an operational amplifier A such as for controlling a transimpedance gain. When an additional programmable capacitor $C_F$ component or circuit (such as can have its capacitance value be controlled by digital input $C_{control}$) is connected in parallel with $R_F$, the circuit can operate as a lowpass filter, with its low-frequency gain determined by the resistance value of the programmable resistor $R_F$ and cutoff frequency, Fc, determined by the $R_F C_F$ product, as shown by Equation 1.

The circuit of FIG. 1 can be used in a variety of systems, such as in complex communications systems, such as in which there is a need for a programmable, wide-range, linear-in-dB transimpedance gain. Because the gain can be determined by the resistance value of $R_F$, the particular application needs (e.g., programmability, wide-range, linear-in-dB control) should be met by this programmable resistor. When the value of $R_F$ is changed by $R_{control}$, $C_{control}$ can also be used to change the capacitance value of $C_F$ for maintaining the same cutoff frequency, if desired.

FIG. 2 shows an example of a differential variant of the circuit of FIG. 1. In FIG. 2, $R_{Fp}$ and $R_{Fn}$ can be like programmable resistors, and $C_{Fp}$ and $C_{Fn}$ can be like programmable capacitors.

Figure 15:
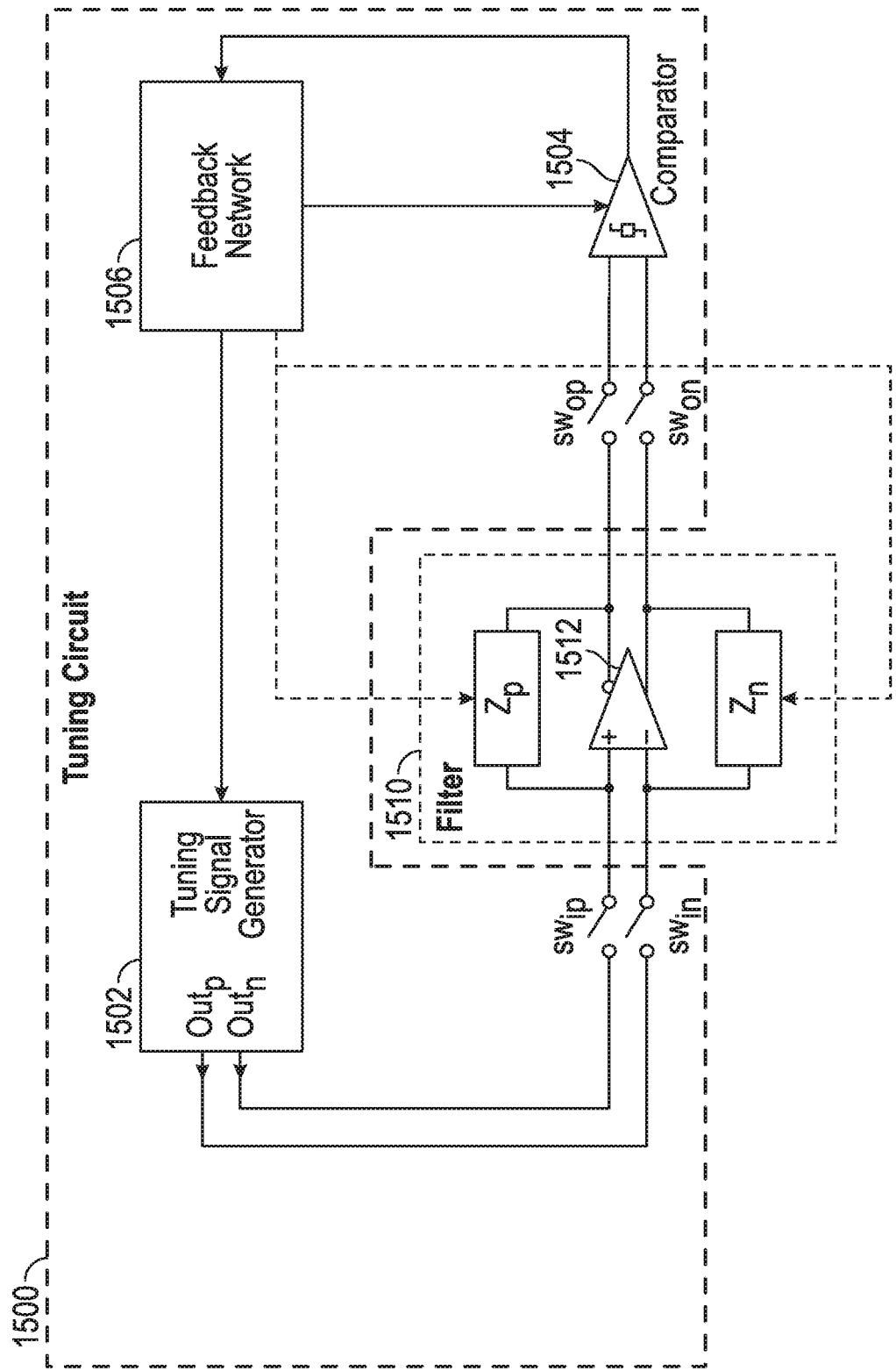
FIG. 15 shows an example of a tuning circuit for an active filter circuit such as can include a programmable resistor in accordance with the present subject matter.

FIG. 15 shows an example of a tuning circuit 1500, such as for adjusting the feedback impedance of an operational amplifier for achieving an accurate lowpass transimpedance filtering characteristic, such as can make use of a programmable resistor, such as one or more of those examples described herein, such as with respect to FIGS. 3-14. Certain aspects of the tuning circuit 1500 of FIG. 15 are described in Fan et al. U.S. Pat. No. 8,836,416 entitled TUNING CIRCUITRY AND METHOD FOR ACTIVE FILTERS, which is assigned to Analog Devices, Inc., and which is incorporated herein by reference in its entirety, including its description of the circuits similar to those shown in FIG. 15 of the present patent application.

FIG. 15 is a block diagram of a tuning circuit 1500 and filter 1510. The tuning circuit 1500 and filter 1510 can be fabricated on a common integrated circuit die or on different dies. The filter 1510 can be selectively disconnected from its normal operation and connected to the tuning circuit 1500, such as with switches 1514, at its input and output, when the filter 1510 needs to be tuned.

The filter 1510 may include an amplifier 1512 and variable/programmable impedances $Z_p$ and $Z_n$. The impedance $Z_p$ may be coupled to an inverting input and a non-inverting output of the amplifier 1512 and impedance $Z_n$ may be coupled to a non-inverting input and an inverting output of the amplifier 1512. The impedances $Z_p$ and $Z_n$ may comprise one or any combination of one or more components such as one or more resistors, one or more capacitors, or one or more inductors. The particular configuration of the impedances $Z_p$, $Z_n$ may determine one or more characteristics of the filter 1510 (e.g., its pass band cutoff frequency). The filter 1510 may include a high pass filter, band pass filter, low pass filter, or any other type of filter, differential or single-ended.

The tuning circuit 1500 may include input resistors or input switches, a tuning signal generator 1502, a comparator 1504, and a feedback network 1506. The input resistors or input switches may be coupled to the inputs of the amplifier 1512 on one end and to respective outputs of the tuning signal generator 1502 on the other end. The comparator's 1504 inputs may be coupled to the outputs of the amplifier 1512, such as via respective switches, and an output of the comparator 1504 may be coupled to the feedback network 1506. The feedback network 1506 may further be coupled to the impedances $Z_p$, $Z_n$ and the tuning signal generator 1502.

The tuning signal generator 1502 may be configured to generate a desired waveform to be input into the filter 1510 such as during a tuning process. The comparator 1504 may compare one or more of one or more voltages or one or more currents and output a value based on the comparison. The feedback network 1506 may generate a reference clock, such as to control the comparator 1504 to sample the filter's 1510 output based on the reference clock, to reset the comparator 1504, and/or analyze the comparator's 1504 output to vary the impedance $Z_p$, $Z_n$ of the filter 1510 as desired according to the tuning process. The reference clock may generate a tuning signal train, a comparator sample clock that governs the sampling period of the comparator 204, and/or a comparator reset clock.

The system of FIG. 15 implicitly assumes that the low-frequency values of $Z_p$ and $Z_n$ do not change over a wide range, such that the filter response (e.g., when switches $sw_{ip}$, $sw_{in}$, $sw_{op}$, $sw_{on}$ are closed when the current tuning pulse is applied) of the filter 1510 is sufficiently small to not saturate the amplifier 1512, but sufficiently large for properly driving the comparator 1504.

Figure 16:
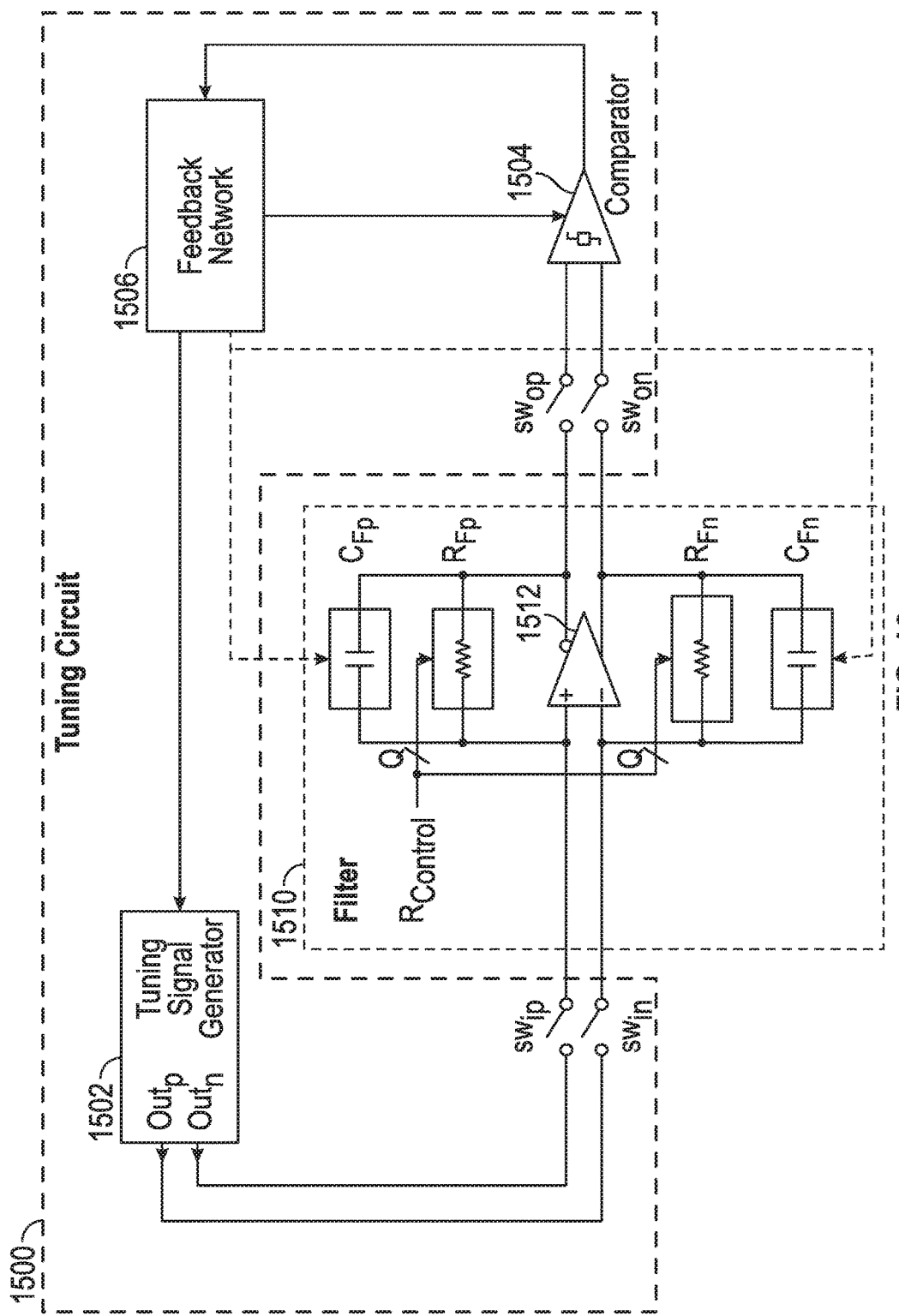
FIG. 16 shows an example of an application of the system of FIG. 15 such as for tuning a filter, such as of the type shown in FIG. 2, such as where the filter gain can be controlled over a wide range, such as using a digital control signal.

FIG. 16 shows an example of an application of the system of FIG. 15 such as for tuning a filter, such as of the type shown in FIG. 2, where the filter gain can be controlled over a wide range, such as using a digital control signal, $R_{control}$.

Figure 17:
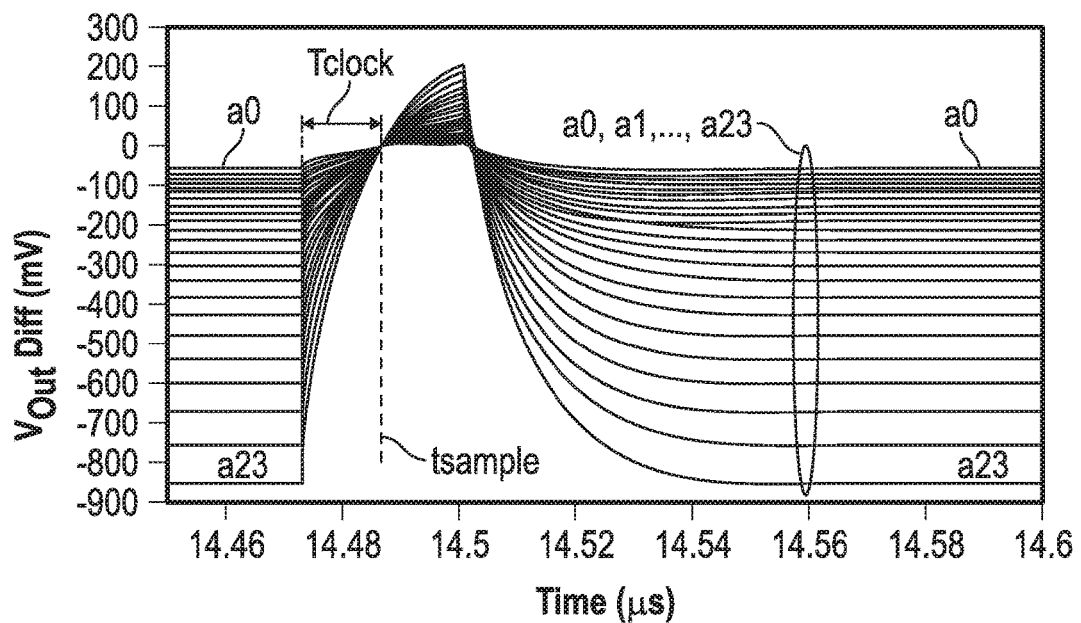
FIG. 17 shows computational (non-experimental) data revealing a potential limitation of the approach shown in FIG. 16.
Figure 17:
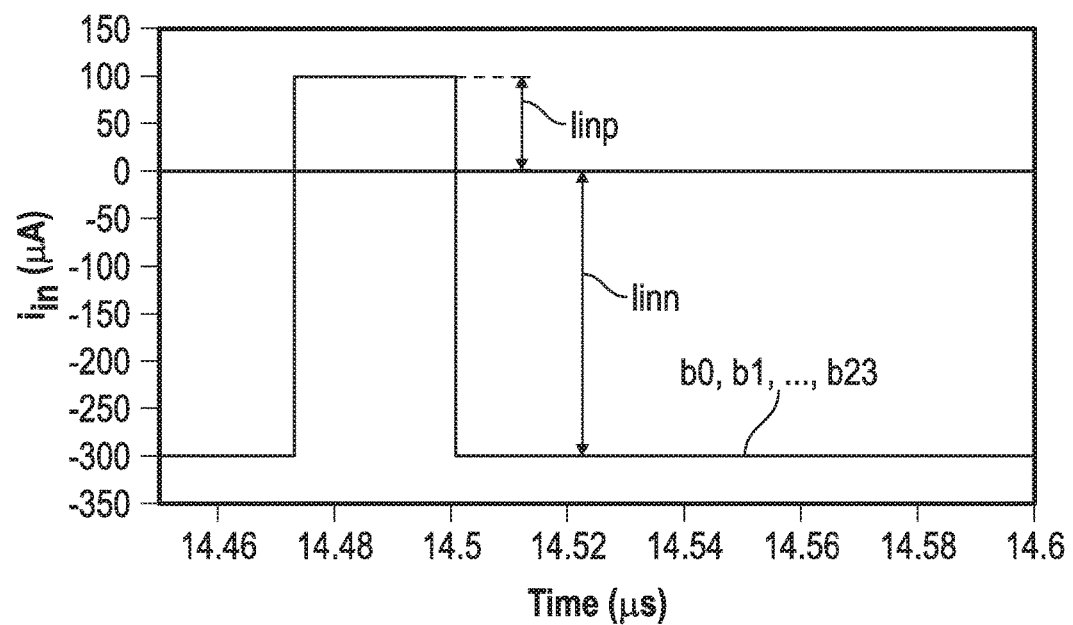
Figure 18:
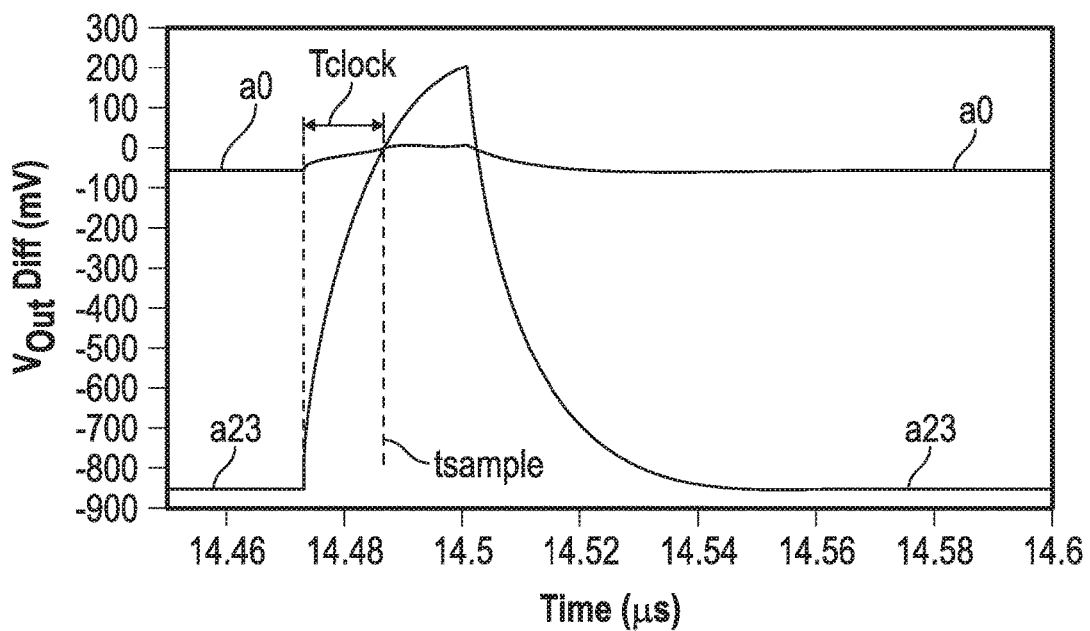
FIG. 18 shows an example of the transient response at the range extremes of FIG. 17.
Figure 18:
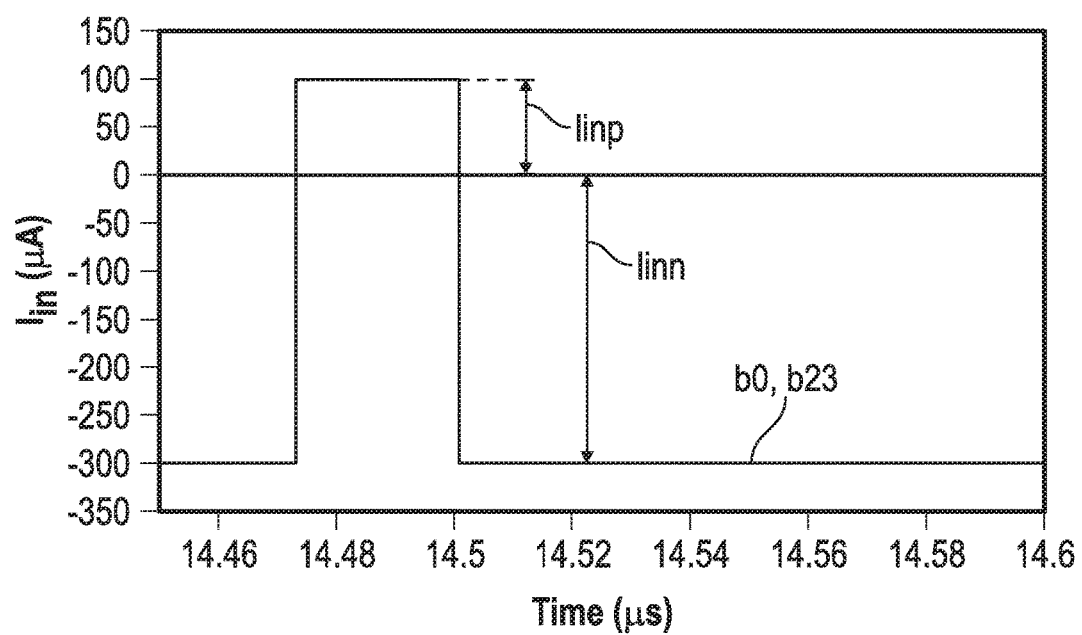

FIG. 17 shows computational (non-experimental) data revealing a potential limitation of this approach. In FIG. 17, the theoretical filter output transients $a_0, \ldots, a_{23}$ are plotted at the end of the tuning process corresponding to each 1-dB gain step in a 0-23 dB range (FIG. 18 illustrates for clarity the transient responses at the range extremes only), along with the overlapping current pulses $b_0, \ldots, b_{23}$ injected into the filter 1510 by the tuning signal generator 1502. Because the amplitude of the tuning pulses is constant regardless of the selected filter gain, the amplitude of $a_{23}$ (corresponding to the largest gain, 23 dB) is also large, potentially causing headroom problems in a low-voltage amplifier 1512 (e.g., such as may be powered from supply voltages such as can be as low as 1.2 V or even lower), which translate into nonlinear operation and eventually tuning errors. At the lowest filter gain (0 dB), the low amplitude of $a_0$ combined with realistic input offset voltages of the comparator 1504 of the tuning circuit 1500, may produce large errors in the switching of the comparator 1504, resulting also in tuning errors. Maintaining a moderate range for the amplitude of the filter transient response during the tuning process can therefore be desirable for accuracy.

Figure 19:
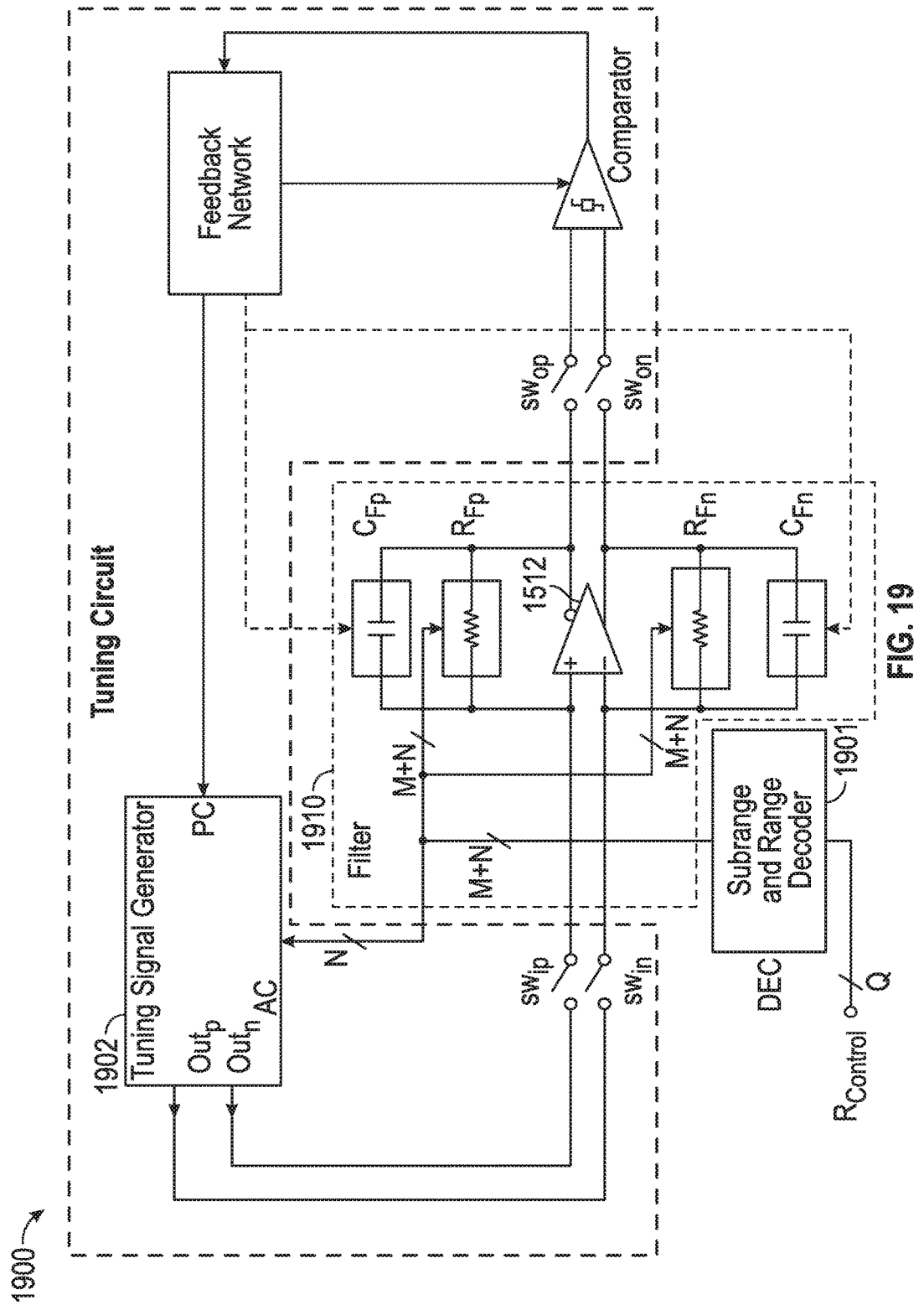
FIG. 19 shows an example of a tuning system in accordance with the present subject matter, such as in which a subrange-and-range decoder can be included such as to control the feedback resistor of the active filter circuit and amplitude of the tuning signal generator.

FIG. 19 shows an example of a tuning system 1900 in accordance with the present subject matter, such as in which a subrange-and-range decoder DEC 1901 can be included such as to control the feedback resistor (e.g., $R_F$, $R_{FN}$) of the active filter 1910 in small increments (such as 1 dB increments, using M bits) over a wide range (such as 23 dB or more), using several ranges such as 6 dB (using N bits, such as described elsewhere in this document). Unlike the tuning signal generator 1502, the tuning signal generator 1902 can include both a pulse-control terminal PC and an amplitude-control terminal AC. The N bits provided by decoder DEC 1901 for range control can be used for controlling the pulse amplitude of the tuning signal generator 1902.

The feedback resistors (e.g., $R_{FP}$, $R_{FN}$) can be implemented as programmable resistors such as shown and described above, for example, such as with respect to FIGS. 9, and 11-13. As explained above, the programmable resistor circuit can employ N cell banks or groups, where each cell bank k, for $k=1, \ldots, N$, can include $2^{(k-1)}$ identical programmable resistor cells, such as of the type shown in FIG. 3, such as can be connected in parallel and between the outside terminals of the programmable resistor. The cell banks or groups 904 can be controlled by the N range bits of the $SR_{control}$ word, which can enable or disable the application of the subrange control word $S_{control}$ to the cell bank or group 904. The resistance value range extension can be achieved in increments, such as of −6 dB, such as by successively halving the total resistance of the programmable resistor structure by successively exercising the N range control bits, such as in a thermometer fashion.

Figure 20:
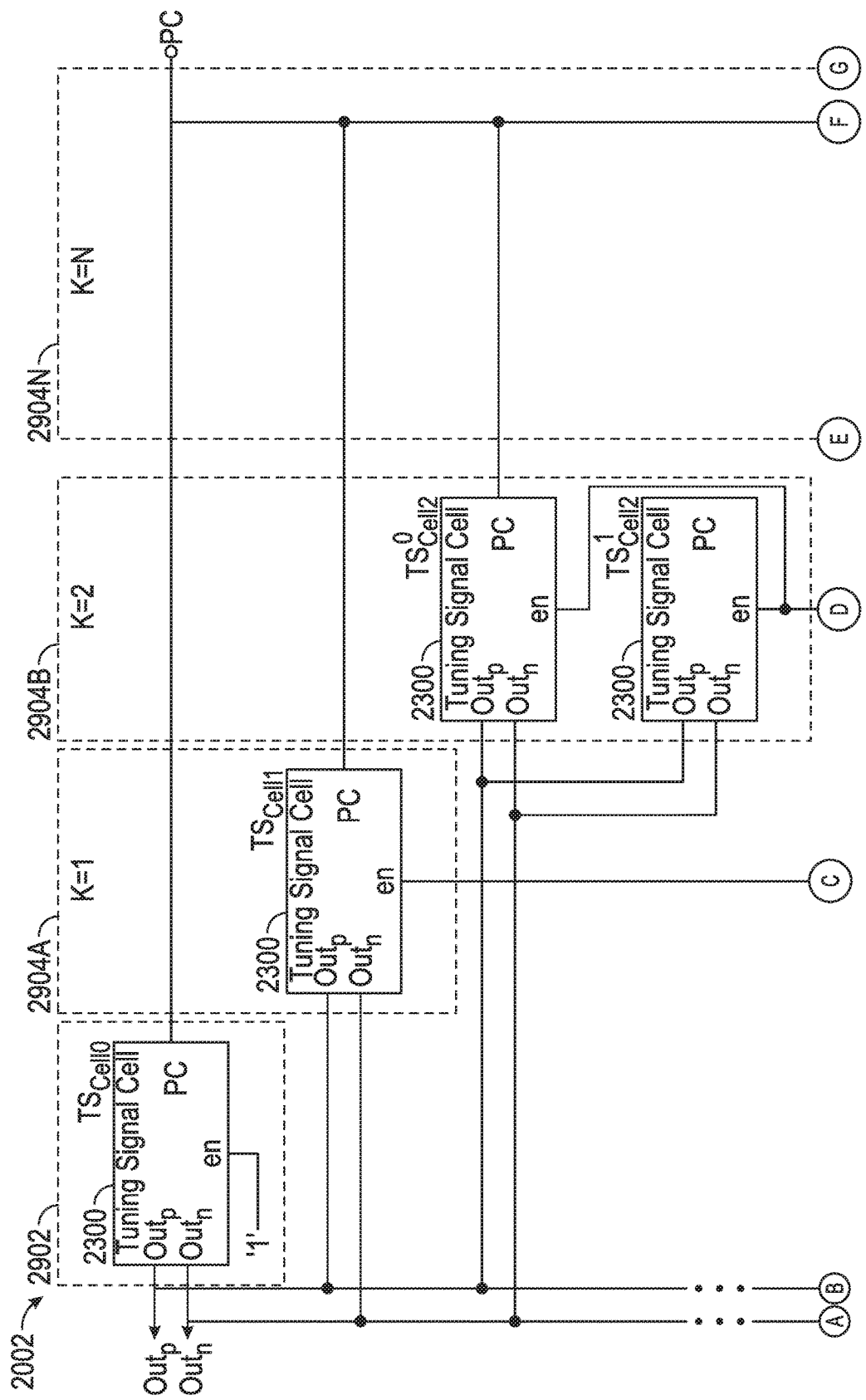
FIG. 20 shows an example of an implementation of a tuning signal generator, such as can be used to implement the tuning signal generator in FIG. 19.
Figure 20:
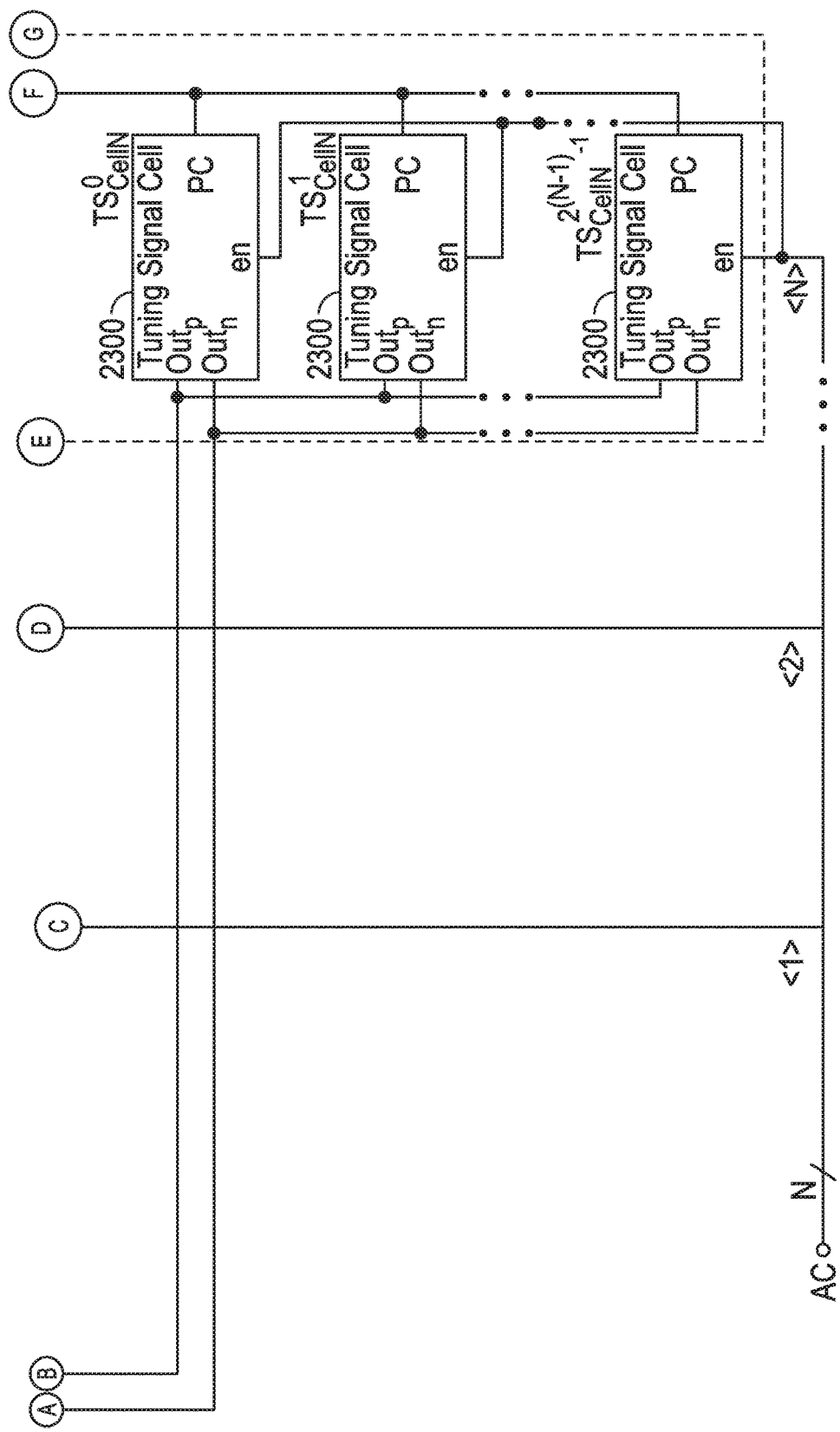

FIG. 20 shows an example of an implementation of a tuning signal generator 2002, such as can be used to implement the tuning signal generator 1902 in FIG. 19.

The architecture of the tuning signal generator 2002 can be similar to the programmable resistor architecture of FIG. 9. For example, the tuning signal generator 2002 can include N tuning signal cell banks or groups 2904, where for a particular cell bank k, for $k=1, \ldots, N$, includes $2^{(k-1)}$ like elementary tuning signal cells 2300 having current outputs outp and outn that can be connected in parallel. The tuning signal cell banks 2904 can be controlled by the same N range bits of the $SR_{control}$ word that can be used in the control of the programmable resistors $R_{Fp}$ and $R_{Fn}$ in FIG. 19. Each elementary tuning signal cell 2300 can be controlled using an enable control pin en, which causes the tuning signal cell 2300 to output no current when this pin is low ('0' logic), and a pulse-control pin PC which has the same function as the control pin of the tuning signal generators in FIGS. 15 and 16.

Figure 21:
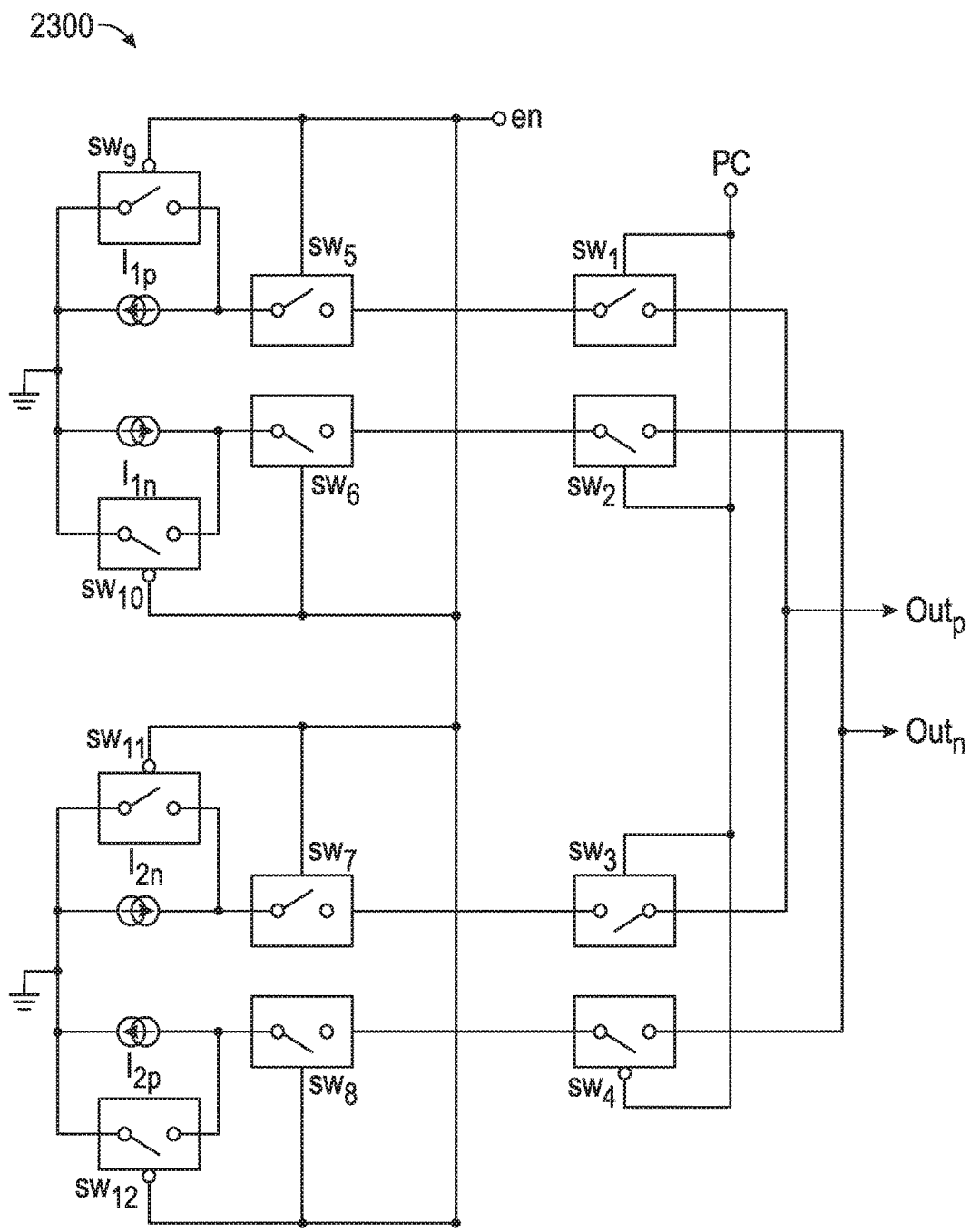
FIG. 21 shows an example of an implementation of a particular tuning signal cell.

FIG. 21 shows an example of an implementation of a particular tuning signal cell 2300, such as in which switches $sw_1, \ldots, sw_{12}$ may be implemented using field-effect transistors, transmission gates, relays, or other switching devices. An enable signal en can be used for allowing currents $I_{1p}$, $I_{1n}$, $I_{2p}$, $I_{2n}$ (where $I_{1p}$, $I_{1n}$ may be equal, and $I_{2p}$, $I_{2n}$ may be equal) to reach the output terminals when en='1', such as according to the polarity of PC, such as by closing switches $sw_5$, $sw_6$, $sw_7$, and $sw_8$; when en='0', no current will reach the output terminals because $sw_5$, $sw_6$, $sw_7$, $sw_8$ are open, and $sw_9$, $sw_{10}$, $sw_{11}$, and $sw_{12}$ are closed and divert such currents to ground. When the tuning signal cell is enabled (en='1'), when PC='1' (high), switches $sw_1$, $sw_2$ are closed, $sw_3$ and $sw_4$ are open, and the tuning signal cell 2300 can output a positive differential current $I_{imp}=I_{1p}+I_{1n}$; when PC='0' (low), switches $sw_3$, $sw_4$ are closed, $sw_1$ and $sw_2$ are open, and the tuning signal cell 2300 can output a negative differential current $I_{imn}=I_{2p}+I_{2n}$.

Figure 22:
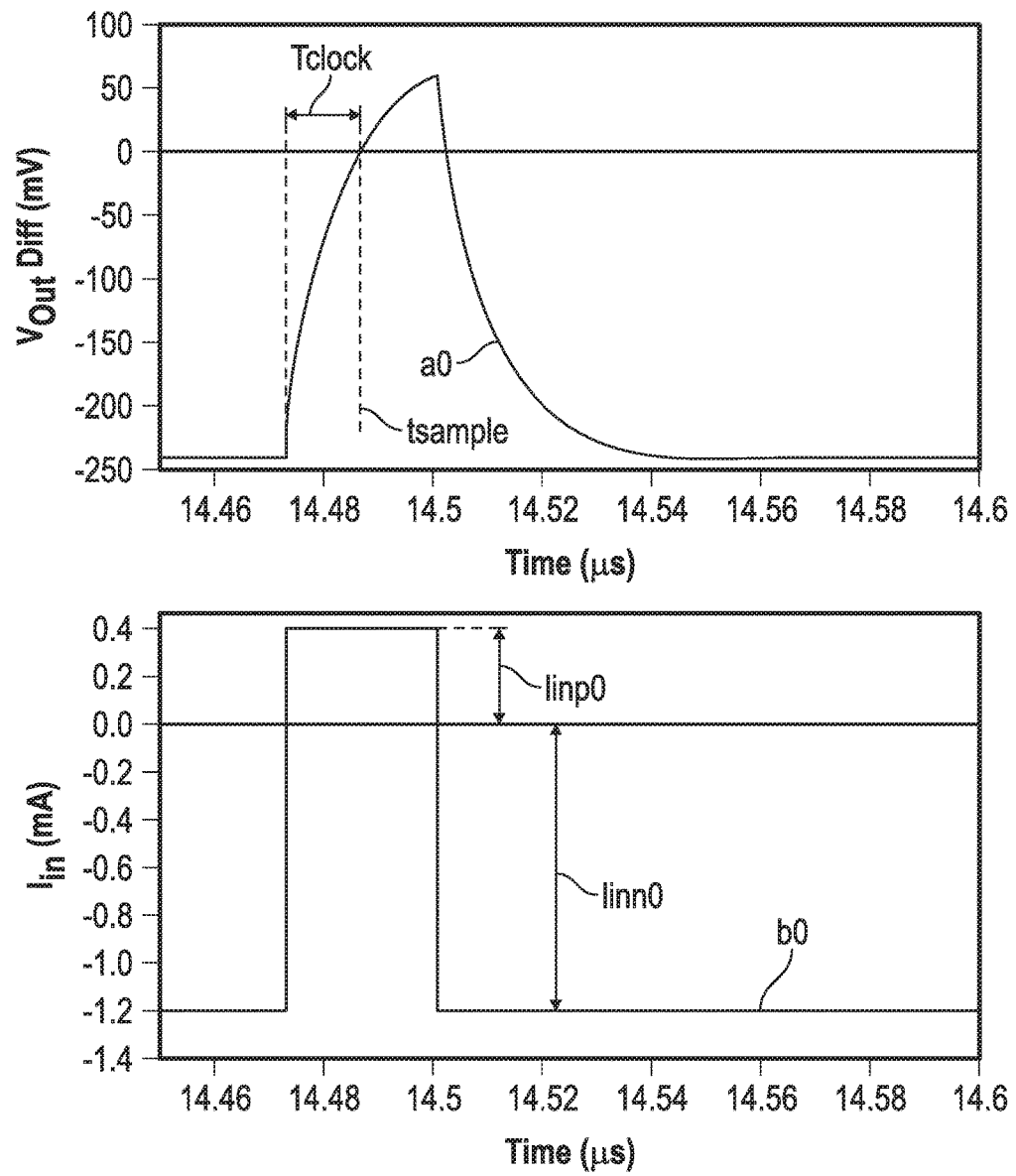
FIGS. 22, 23, and 24 illustrate an example of computer simulation results of examples of output waveforms of a tuned variable-gain filter such as in FIG. 19.
Figure 23:
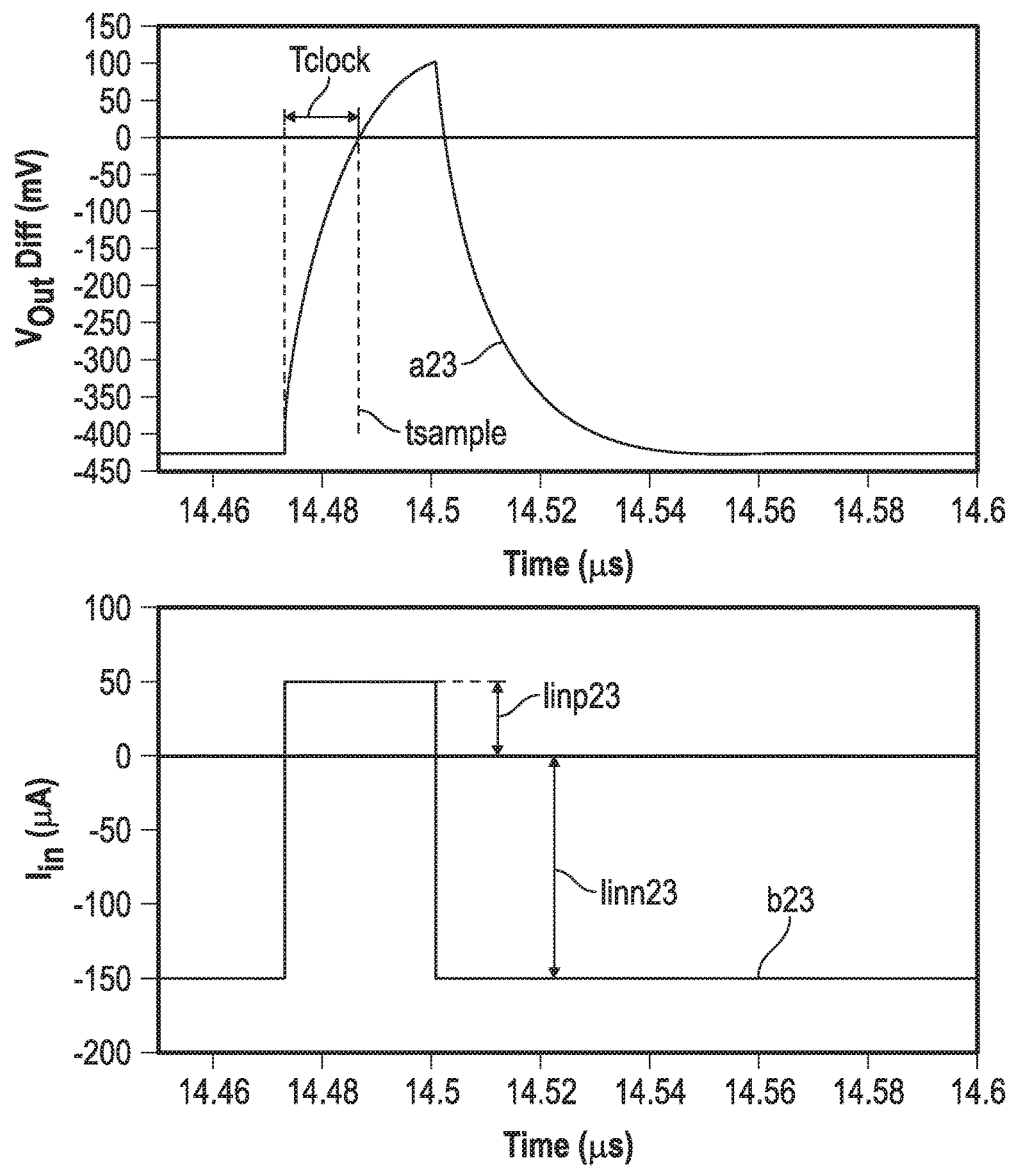
Figure 24:
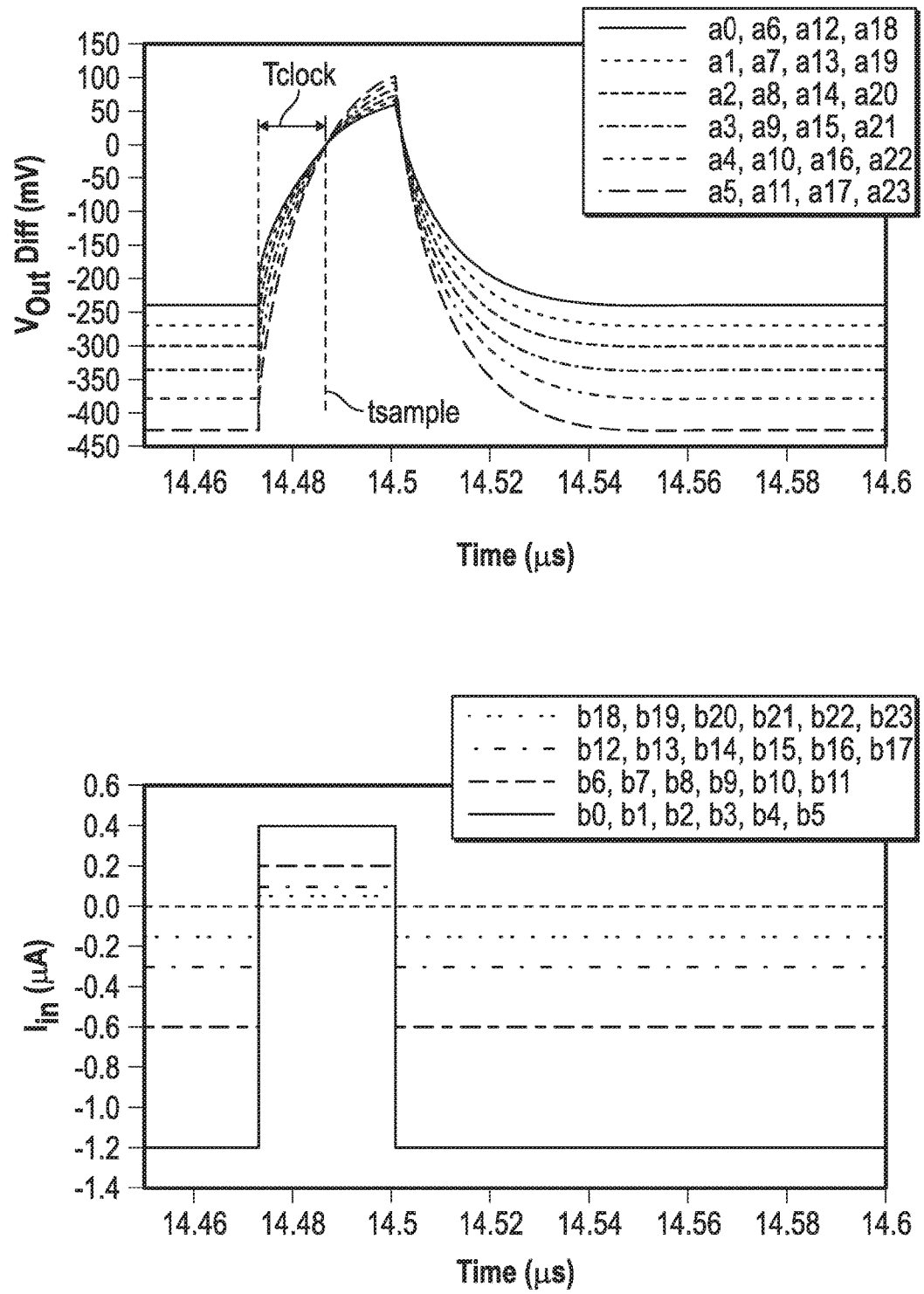

FIGS. 22, 23, and 24 illustrate an example of computer simulation results of examples of output waveforms of a tuned variable-gain filter such as in FIG. 19 and their corresponding input tuning pulses, using N=3 additional resistor cell banks 904 and tuning cell banks 2904, for a total of eight identical resistor cells 300 and eight identical tuning signal cells 2300, such as according to FIGS. 9 and 20, respectively. Each programmable resistor cell 300, $R_{cellj}^{i}$, $i=0, \ldots, 2^{(j-1)}-1$; $j=1, \ldots, 3$, can have the configuration shown in FIG. 3 where M=6, for 6 equal 1-dB steps. The DEC decoder 1901 in FIG. 19 can be configured to generate programmable resistance values that change according to a subrange control, such as illustrated in the example of Table 1. If the control signals of the switches follow a thermometer scheme (e.g., in which a switch is closed only after higher-rank switches are closed), six 1-dB-spaced resistance values can be obtained, such as shown in the example of Table 2. Table 4 shows an example of the final resistance values as functions of the $R_{control}$ code values in FIG. 9 and the output bits of decoder DEC 1901, where $SR_{control}$<8:6> are the range control bits and $SR_{control}$ <5:0> are the subrange control bits of the programmable resistor. The range control bits $SR_{control}$<8:6> can also used to control the amplitudes of the tuning pulse $I_{imp}$ and $I_{inn}$, which are also listed in Table 4.

TABLE 4

| $R_{control}$ | $SR_{control}$<8:6> | | | $SR_{control}$<5:0> | | | | | | $R_{AB}$ | $R_{AB}$ | $I_{inp}$ | $I_{inn}$ |
|---|---|---|---|---|---|---|---|---|---|---|---|---|---|
| (decimal) | <8> | <7> | <6> | <5> | <4> | <3> | <2> | <1> | <0> | (Ω) | (dB) | (μA) | (μA) |
| 0 | 1 | 1 | 1 | 1 | 1 | 1 | 1 | 1 | 1 | 199.3 | 0 | 400 | 1200 |
| 1 | 1 | 1 | 1 | 1 | 1 | 1 | 1 | 1 | 0 | 224.5 | +1 | 400 | 1200 |
| 2 | 1 | 1 | 1 | 1 | 1 | 1 | 1 | 0 | 0 | 251.7 | +2 | 400 | 1200 |
| 3 | 1 | 1 | 1 | 1 | 1 | 1 | 0 | 0 | 0 | 282.5 | +3 | 400 | 1200 |
| 4 | 1 | 1 | 1 | 1 | 1 | 0 | 0 | 0 | 0 | 316.8 | +4 | 400 | 1200 |
| 5 | 1 | 1 | 1 | 1 | 0 | 0 | 0 | 0 | 0 | 355.6 | +5 | 400 | 1200 |
| 6 | 1 | 1 | 0 | 1 | 1 | 1 | 1 | 1 | 1 | 398.7 | +6 | 200 | 600 |
| 7 | 1 | 1 | 0 | 1 | 1 | 1 | 1 | 1 | 0 | 449 | +7 | 200 | 600 |
| 8 | 1 | 1 | 0 | 1 | 1 | 1 | 1 | 0 | 0 | 503.5 | +8 | 200 | 600 |
| 9 | 1 | 1 | 0 | 1 | 1 | 1 | 0 | 0 | 0 | 565 | +9 | 200 | 600 |
| 10 | 1 | 1 | 0 | 1 | 1 | 0 | 0 | 0 | 0 | 633.7 | +10 | 200 | 600 |
| 11 | 1 | 1 | 0 | 1 | 0 | 0 | 0 | 0 | 0 | 711.2 | +11 | 200 | 600 |
| 12 | 1 | 0 | 0 | 1 | 1 | 1 | 1 | 1 | 1 | 797.5 | +12 | 100 | 300 |
| 13 | 1 | 0 | 0 | 1 | 1 | 1 | 1 | 1 | 0 | 898 | +13 | 100 | 300 |
| 14 | 1 | 0 | 0 | 1 | 1 | 1 | 1 | 0 | 0 | 1007 | +14 | 100 | 300 |
| 15 | 1 | 0 | 0 | 1 | 1 | 1 | 0 | 0 | 0 | 1130 | +15 | 100 | 300 |
| 16 | 1 | 0 | 0 | 1 | 1 | 0 | 0 | 0 | 0 | 1267.5 | +16 | 100 | 300 |
| 17 | 1 | 0 | 0 | 1 | 0 | 0 | 0 | 0 | 0 | 1422.5 | +17 | 100 | 300 |
| 18 | 0 | 0 | 0 | 1 | 1 | 1 | 1 | 1 | 1 | 1595 | +18 | 50 | 150 |
| 19 | 0 | 0 | 0 | 1 | 1 | 1 | 1 | 1 | 0 | 1796 | +19 | 50 | 150 |
| 20 | 0 | 0 | 0 | 1 | 1 | 1 | 1 | 0 | 0 | 2014 | +20 | 50 | 150 |
| 21 | 0 | 0 | 0 | 1 | 1 | 1 | 0 | 0 | 0 | 2260 | +21 | 50 | 150 |
| 22 | 0 | 0 | 0 | 1 | 1 | 0 | 0 | 0 | 0 | 2535 | +22 | 50 | 150 |
| 23 | 0 | 0 | 0 | 1 | 0 | 0 | 0 | 0 | 0 | 2845 | +23 | 50 | 150 |

FIG. 22 illustrates an example of the output waveform and tuning pulse corresponding to the minimum gain ($R_{control}$=0, for the reference 0 dB gain), FIG. 23 illustrates an example of the output waveform and tuning pulse corresponding to the maximum gain ($R_{control}$=23, for the reference 23 dB gain), and FIG. 24 shows examples of the output waveforms and tuning pulses corresponding to all the gains selected in the 0-23 dB range ($R_{control}$=0, 1, 2, . . . , 23). As illustrated in FIG. 24, the output waveforms and tuning pulses practically overlap at filter gains 6 dB apart regardless of the number of resistor cell banks 904 and tuning cell banks 2904, and, in contrast to FIG. 17, exhibit a relatively small variation in amplitude of only 5 dB compared to the gain variation of 23 dB, ensuring proper signal levels for good tuning accuracy regardless of filter gain.

Figure 25:
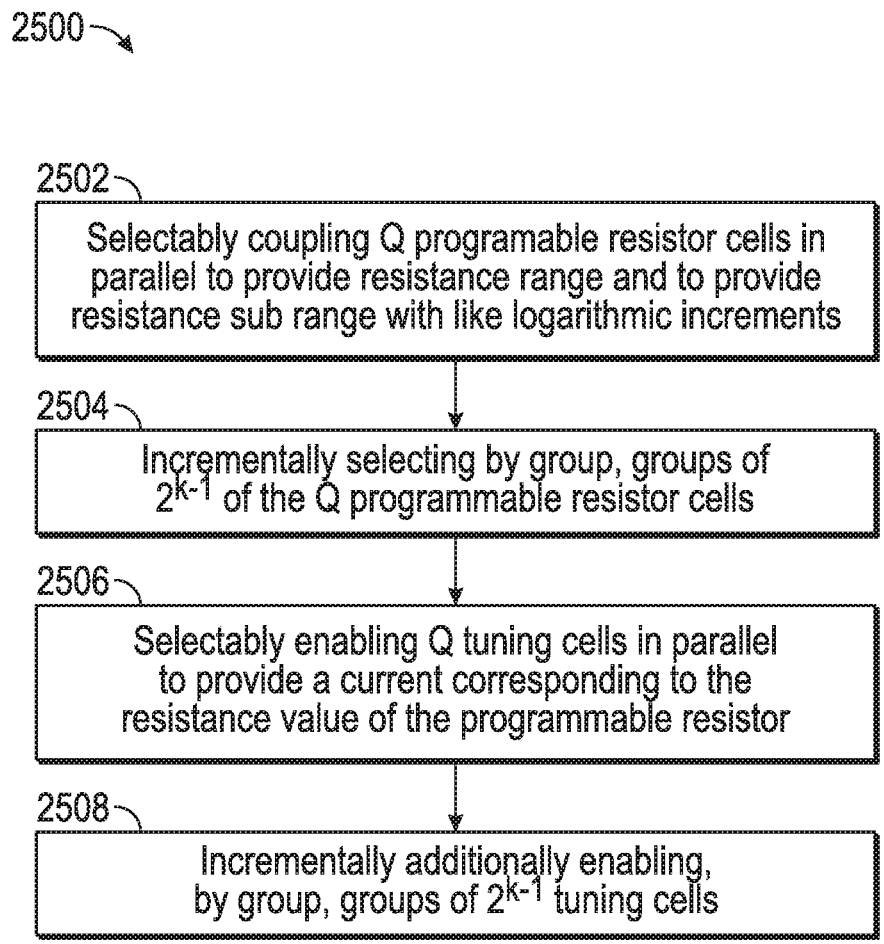
FIG. 25 shows an example of a method of use of the programmable resistor, either alone as a standalone programmable resistor, or together with tuning cells for selecting filter gain of a programmable active filter circuit.

FIG. 25 shows an example of a method 2500 of use of the programmable resistor, either alone as a standalone programmable resistor (shown at 2502 and 2504), or together with tuning cells for selecting filter gain of a programmable active filter circuit (shown at 2502, 2504, 2506, and 2508).

At 2502, the method 2500 can include selectably coupling a number Q of programmable resistor cells in parallel, where Q is greater than or equal to two, including for each programmable resistor cell programming a like arrangement of at least two resistors into a parallel configuration to provide a resistance subrange that provides like logarithmic increments within the resistance subrange.

At 2504, the method 2500 can further include incrementally additionally selecting by group, into a parallel arrangement with a first one of the Q programmable cells, particular groups of $2^{k-1}$ of the Q programmable resistor cells where k is an integer greater than or equal to one, so as to establish a range of resistance values including (k+1) adjacent non-overlapping resistance subranges, with equal logarithmic increments between the adjacent non-overlapping resistance subranges within the range of resistance values provided by the programmable resistor.

At 2506, the method 2500 can optionally additionally include selectably enabling a number Q of tuning signal cells in parallel, where Q is greater than or equal to two, including for each tuning signal cell programming a like arrangement of at least two current sources to provide a current corresponding to the resistance value of the programmable resistor; and At 2508, the method 2500 can optionally additionally include incrementally additionally enabling by group, into a parallel arrangement with a first one of the Q tuning signal cells, particular groups of $2^{k-1}$ of the Q tuning signal cells where k is an integer greater than or equal to one, and activating the programmable tuning signal cells that are enabled, the activating controlled using a Pulse Control (PC) signal that is based on the comparison using the amplifier output of the active filter circuit.

Various Notes

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A programmable resistor, comprising:
    programmable resistor cells that are selectively coupled in parallel to each other between an input node and an output node, where each programmable resistor cell includes a plurality of resistors selectively coupled in parallel to each other between the input node and the output node by respective switches, wherein resistance of a first of the programmable resistor cells changes in logarithmic increments from a first resistance value up to a first resistance subrange of the first programmable resistor cell in response to individual ones of the plurality of resistors of the first programmable resistor cell being selectively coupled between the input node and the output node, wherein resistance of a second of the programmable resistor cells changes in logarithmic increments from a second resistance value up to a second resistance subrange of the second programmable resistor cell in response to individual ones of the plurality of resistors of the second programmable resistor cell being selectively coupled between the input node and the output node, and wherein the second resistance value corresponds to a logarithmic increment from the first resistance subrange of the first programmable resistor cell; and
    a decoder circuit selecting the programmable resistor cells and the plurality of resistors of the programmable resistor cells that are selectively coupled in parallel to each other between the input node and the output node to control a resistance value of the programmable resistor.

2. The programmable resistor of claim 1, wherein:
    the plurality of resistors of the first programmable resistor cell comprises at least three resistors including first, second, and third resistors, respectively having corresponding first, second, and third resistance values;
    the switches of the first programmable resistor cell comprise at least three switches, including first, second, and third switches, coupled respectively in series with a corresponding one of the first resistor, the second resistor, and the third resistor;
    wherein when the first switch is on and the second and third switches are off, the first programmable resistor cell is in a first state in which the resistance of the first programmable resistor cell corresponds to the first value of the first resistor, and
    wherein when the first and second switches are on and the third switch is off, the first programmable resistor cell is in a second state in which the resistance of the first programmable resistor cell corresponds to a parallel combination of the first and second values of the first and second resistors, and
    when the first, second, and third switches are all on, the first programmable resistor cell is in a third state in which the resistance of the first programmable resistor cell corresponds to a parallel combination of the first, second and third values of the first, second, and third resistors; and
    wherein the first resistance value, the second resistance value, and the third resistance values are selected to provide the logarithmic increments of the first programmable resistor cell between (1) the first and second states of the first programmable resistor cell, and (2) between the second and third states of the first programmable resistor cell.

3. The programmable resistor of claim 1, wherein:
the plurality of resistors of the first programmable resistor cell comprises at least two resistors including first and second resistors, respectively having corresponding first and second resistance values;
the switches of the first programmable resistor cell comprise at least two switches, including first and second switches, coupled respectively in series with a corresponding one of the first resistor and the second resistor;
wherein when the first switch is on and the second switch is off, the first programmable resistor cell is in a first state in which the resistance of the first programmable resistor cell corresponds to the first value of the first resistor,
wherein when the first and second switches are on, the first programmable resistor cell is in a second state in which resistance of the first programmable resistor cell corresponds to a parallel combination of the first and second values of the first and second resistors; and
wherein the first resistance value and the second resistance value are selected to provide the logarithmic increments of the first programmable resistor cell between the first and second states of the first programmable resistor cell.

4. The programmable resistor of claim 1, wherein each programmable resistor cell is configured to provide a 6 dB resistance subrange.

5. The programmable resistor of claim 1, wherein each programmable resistor cell is configured to provide a 3 dB maximum step between adjacent resistance values.

6. The programmable resistor of claim 1, wherein the decoder circuit comprises a subrange decoder circuit and at least one AND cell.

7. The programmable resistor of claim 6, wherein the at least one AND cell includes a plurality of AND gates respectively mapping input bits of a control word to an output control word by a logical AND function with a range selection bit to control incrementally the programmable resistor cells and the plurality of resistors of the programmable resistor cells that are selectively coupled in parallel to each other between the input node and the output node.

8. The programmable resistor of claim 1, wherein the decoder circuit includes a subrange and range decoder circuit with at least one designated control bit used to control incrementally the programmable resistor cells and the plurality of resistors of the programmable resistor cells that are selectively coupled in parallel to each other between the input node and the output node.

9. The programmable resistor of claim 1, wherein the programmable resistor is coupled to a variable-gain active filter circuit, wherein the programmable resistor is used as a programmable feedback resistor to tune a gain of the variable-gain active filter circuit, and wherein the variable gain active filter circuit comprises:
an amplifier circuit, including an operational amplifier coupled to the programmable resistor and a capacitor in a feedback configuration with the operational amplifier;
a comparator circuit, coupled to an output of the operational amplifier to compare an output signal of the operational amplifier to a reference during a tuning mode; and
a tuning signal generator circuit, coupled to receive an output of or based on the comparator circuit at a pulse control input of the tuning signal generator circuit, and to adjust a tuning signal provided to the amplifier circuit in a tuning mode to determine a desired resistance value of the programmable feedback resistor in a normal mode; and
wherein the decoder circuit is configured to provide a decoder output signal to control the resistance value of the programmable feedback resistor in the normal mode and to control an amplitude of the tuning signal.

10. The programmable resistor and variable gain active feedback circuit combination of claim 9, in which the tuning signal generator circuit comprises:
programmable tuning signal cells that are selectably couplable in parallel, and include at least two current sources that are individually programmable into a parallel configuration by respective individual series switches to provide a current corresponding to the resistance value of the programmable resistor; and
wherein the decoder circuit is configured to be capable of selectively enabling particular groups of tuning signal cells.

11. A method of using a programmable resistor, the method comprising:
selectively coupling programmable resistor cells in parallel to each other between an input node and an output node, where each programmable resistor cell includes a plurality of resistors selectively coupled in parallel to each other between the input node and the output node by respective switches, wherein resistance of a first of the programmable resistor cells changes in logarithmic increments to provide logarithmic increments from a first resistance value up to a first resistance subrange of the first programmable resistor cell in response to individual ones of the plurality of resistors of the first programmable resistor cell being selectively coupled between the input node and the output node, wherein resistance of a second of the programmable resistor cells changes in logarithmic increments from a second resistance value up to a second resistance subrange of the second programmable resistor cell in response to individual ones of the plurality of resistors of the second programmable resistor cell being selectively coupled between the input node and the output node, and wherein the second resistance value corresponds to a logarithmic increment from the first resistance subrange of the first programmable resistor cell; and
selecting the programmable resistor cells and the plurality of resistors of the programmable resistor cells that are selectively coupled in parallel to each other between the input node and the output node to control a resistance value of the programmable resistor.

12. The method of claim 11, wherein:
the plurality of resistors of the first programmable resistor cell comprises at least two resistors including first and second resistors, respectively having corresponding first and second resistance values;
the switches of the first programmable resistor cell comprise at least two switches, including first and second switches, respectively coupled in series with a corresponding one of the first resistor and the second resistor; and
providing a first state, wherein when the first switch is on and the second switch is off, the first programmable resistor cell is in the first state in which the resistance of the first programmable resistor cell corresponds to the first value of the first resistor, and providing a second state, wherein when the first and second switches are on, the first programmable resistor cell is in the second state in which the resistance of the first programmable resistor cell corresponds to a parallel combination of the first and second values of the first and second resistors; and wherein the first resistance value and the second resistance value are selected to provide the logarithmic increments of the first programmable resistor cell between the first and second states of the first programmable resistor cell.

13. The method of claim 11, comprising providing a 6 dB resistance subrange for each programmable resistor cell.

14. The method of claim 11, comprising providing a 3 dB maximum step between adjacent resistance values for each programmable resistor cell.

15. The method of claim 11, in which the selecting comprises incrementally controlling the programmable resistor cells and the plurality of resistors of the programmable resistor cells that are selectively coupled in parallel to each other between the input node and the output node using at least a decoder circuit.

16. The method of claim 11, using bits of a control word to select a resistance within a subrange and using a range selection bit to control the selecting.

17. The method of claim 11 further comprising controlling a gain of an active filter circuit including the resistance value of the programmable resistor.

18. The method of claim 17 further comprising using a tuning mode in which a tuning current provided to the active filter circuit is based at least in part upon a comparison using an amplifier output of the active filter circuit.

19. The method of claim 18 further comprising, in the tuning mode:
selectably enabling a number of tuning signal cells in parallel, including for each tuning signal cell programming a like arrangement of at least two current sources to provide a current corresponding to the resistance value of the programmable resistor; and
incrementally additionally enabling by group, into a parallel arrangement with a first one of the tuning signal cells, particular groups of the tuning signal cells and activating the programmable tuning signal cells that are enabled, the activating controlled using a Pulse Control (PC) signal that is based on the comparison using the amplifier output of the active filter circuit.

20. A method of using a programmable resistor, the method comprising:

providing a first resistor cell that includes a first programmable resistance that changes based on a control signal in logarithmic increments from a first resistance value up to a first range;
providing a second resistor cell that includes a second programmable resistance that changes based on the control signal in logarithmic increments from a second resistance value up to a second range, that second resistance value corresponding to a logarithmic increment from the first range; and
setting a resistance for the programmable resistor by coupling, based on the control signal, the first and second resistor cells in parallel between an input node and an output node of the the programmabe resistor.

21. The method of claim 20 further comprising causing the control signal to activate respective switches to control which of a plurality of resistors in the first resistor cell is coupled in parallel to each other between the input node and the output node.

22. The method of claim 20, wherein a lowest resistance value of the second range corresponds to a prespecified increment from a maximum resistance value of the first range.

23. A programmable resistor comprising:
means for providing a first resistor cell that includes a first programmable resistance that changes based on a control signal in logarithmic increments from a first resistance value up to a first range;
means for providing a second resistor cell that includes a second programmable resistance that changes based on the control signal in logarithmic increments from a second resistance value up to a second range, that second resistance value corresponding to a logarithmic increment from the first range; and
means for setting a resistance for the programmable resistor by coupling, based on the control signal, the means for providing the first and second programmable resistance in parallel between an input node and an output node of the programmable resistor.

24. The programmable resistor of claim 23 further comprising means for causing the control signal to activate respective switching means to control which of a plurality of resistor means in the means for providing the first programmable resistance is coupled in parallel to each other between the input node and the output node.

25. The programmable resistor of claim 23, wherein a lowest resistance value of the second range corresponds to a prespecified increment from a maximum resistance value of the first range.

* * * * *

UNITED STATES PATENT AND TRADEMARK OFFICE
CERTIFICATE OF CORRECTION

PATENT NO. : 10,291,207 B2
APPLICATION NO. : 15/204673
DATED : May 14, 2019
INVENTOR(S) : Ciubotaru et al.

Page 1 of 1

It is certified that error appears in the above-identified patent and that said Letters Patent is hereby corrected as shown below:

On the Title Page

In item (72), in "Inventors", in Column 1, Line 2, delete "Somerset, NJ" and insert --Coconut Creek, FL-- therefor In item (57), in "Abstract", in Column 2, Line 6, delete "[0 dB, -6 dB)" and insert --(0 dB, -6 dB)-- therefor In the Claims In Column 20, Line 14, in Claim 20, delete "the the programmabe" and insert --the programmable-- therefor Signed and Sealed this
Fourteenth Day of April, 2020

Andrei Iancu
*Director of the United States Patent and Trademark Office*